United States Patent
Rastegar

(10) Patent No.: US 9,527,722 B2
(45) Date of Patent: *Dec. 27, 2016

(54) INERTIA SENSORS WITH MULTI-DIRECTIONAL SHOCK PROTECTION

(71) Applicant: Jahangir S Rastegar, Stony Brook, NY (US)

(72) Inventor: Jahangir S Rastegar, Stony Brook, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 566 days.

This patent is subject to a terminal disclaimer.

(21) Appl. No.: 13/915,602

(22) Filed: Jun. 11, 2013

(65) Prior Publication Data

US 2015/0251897 A1     Sep. 10, 2015

Related U.S. Application Data

(60) Provisional application No. 61/658,328, filed on Jun. 11, 2012.

(51) Int. Cl.
| | |
|---|---|
| *B81B 7/00* | (2006.01) |
| *G01C 19/5755* | (2012.01) |
| *G01P 15/125* | (2006.01) |
| *G01P 15/18* | (2013.01) |
| *G01P 15/08* | (2006.01) |

(52) U.S. Cl.
CPC ......... *B81B 7/0016* (2013.01); *G01C 19/5755* (2013.01); *G01P 15/0891* (2013.01); *G01P 15/125* (2013.01); *G01P 15/18* (2013.01); *B81C 2201/0195* (2013.01); *G01P 2015/0814* (2013.01); *G01P 2015/0837* (2013.01); *G01P 2015/0871* (2013.01)

(58) Field of Classification Search
CPC .............. B81B 7/0016; G01P 15/0802; G01P 2015/0871; G01P 15/02; G01P 15/0891; G01P 2015/0837
USPC ..... 73/514.38, 514.36, 514.29, 12.01, 12.04, 73/652, 526
See application file for complete search history.

(56) References Cited

U.S. PATENT DOCUMENTS

| | | | | |
|---|---|---|---|---|
| 6,626,040 B1* | 9/2003 | Pereira | ..................... | F42B 15/01 73/514.38 |
| 7,559,238 B1* | 7/2009 | Smith | ..................... | G01P 1/127 73/12.04 |
| 8,646,334 B2* | 2/2014 | Rastegar | ............ | G01C 19/5769 73/514.38 |

* cited by examiner

Primary Examiner — Michael A Lyons
Assistant Examiner — Suman K Nath

(57) ABSTRACT

A MEMS sensor including: a base structure; at least one component formed from the base structure which moves relative to the base structure; and one or more locking mechanisms for locking the at least one component in a predetermined stationary position in response to external stimuli exceeding predetermined thresholds in at least first and second directions, where the first direction is different from the second direction.

16 Claims, 25 Drawing Sheets

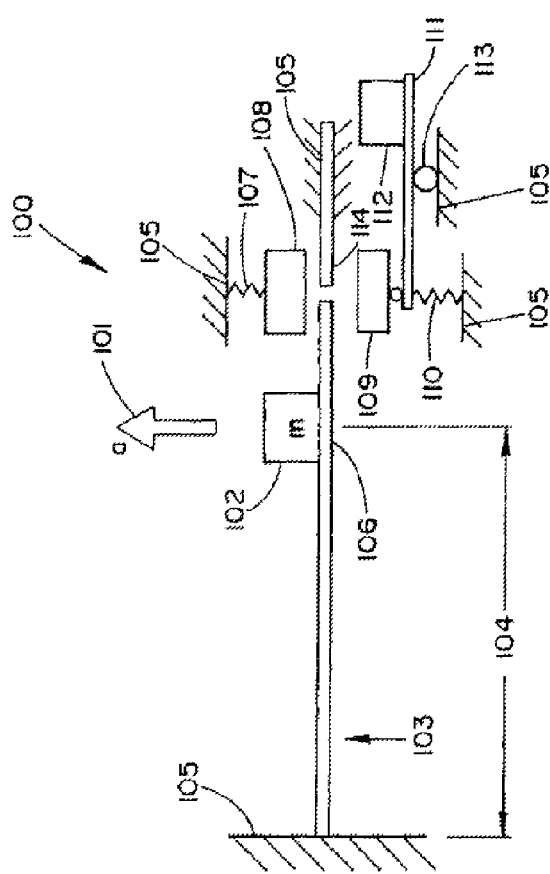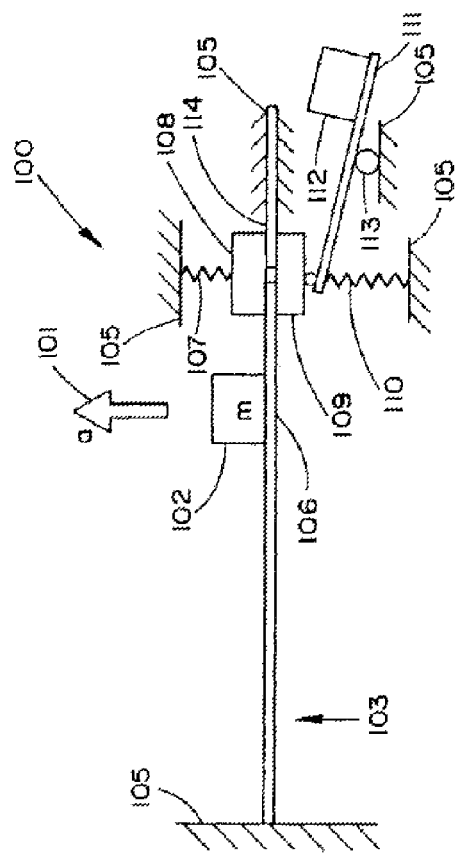

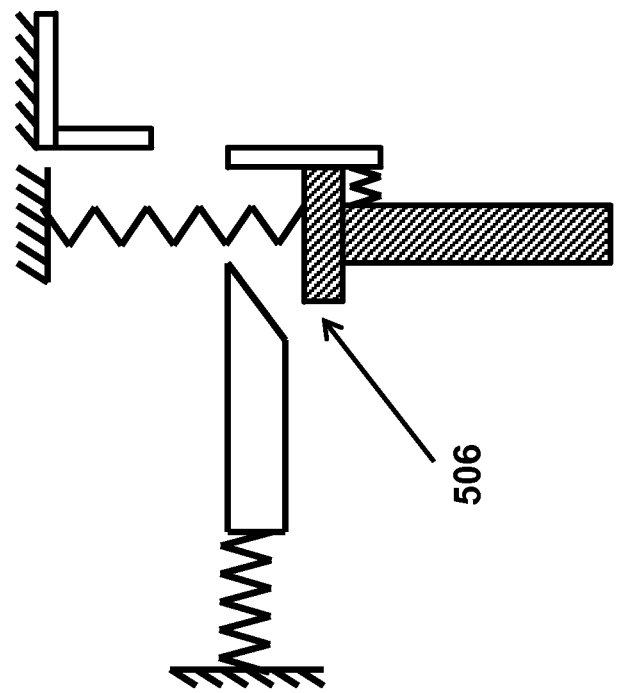
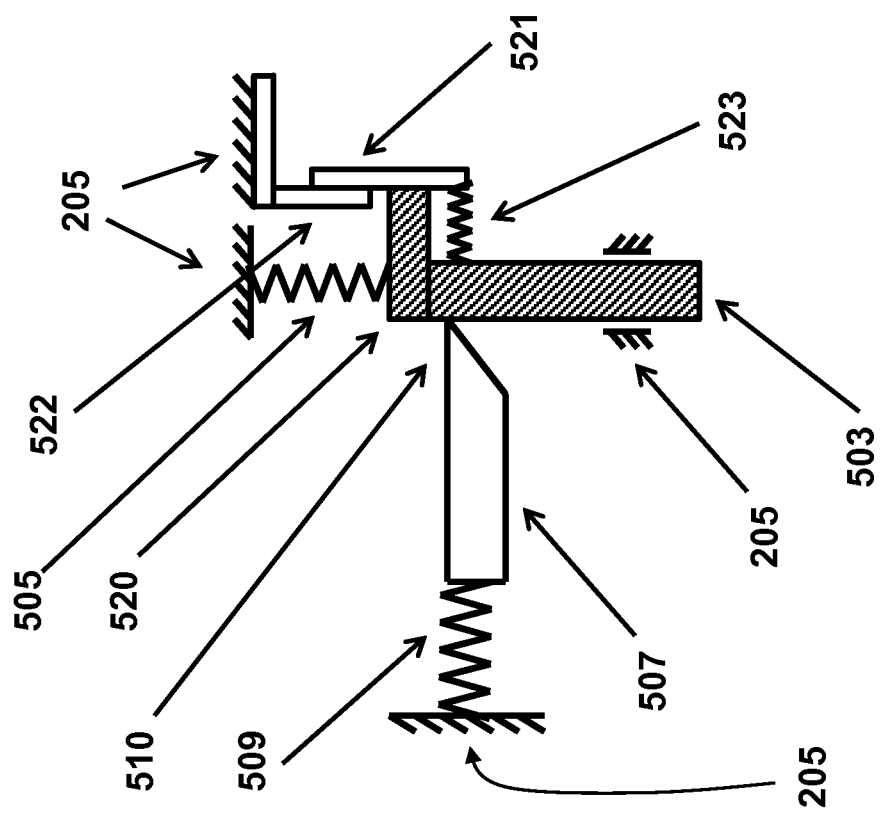
Figure 11b
Figure 11a

INERTIA SENSORS WITH MULTI-DIRECTIONAL SHOCK PROTECTION

CROSS-REFERENCE TO RELATED APPLICATION

This application claims the benefit of U.S. Provisional Application No. 61/658,328 filed on Jun. 11, 2013, the entire contents of which is incorporated herein by reference.

GOVERNMENT RIGHTS

The U.S. Government has a paid-up license in this invention and the right in limited circumstances to require the patent owner to license others on reasonable terms as provided for by the terms of SBIR Grant No. W15QKN-10-C-0068 awarded by the Department of Defense on Jun. 10, 2010.

BACKGROUND OF THE INVENTION

1. Field of the Invention

The present invention relates generally to sensors, and more particularly, to accelerometers and inertia based gyros that are hardened to multi-directional shock experienced during high-G (G indicating the gravitational acceleration of around 9.8 m/sec$^2$) firing setback and set-forward.

2. Prior Art

The state of art in shock resistant accelerometer and inertia based gyro design is to reduce the size of the moving proof mass (gyroscopic proof mass for the case of inertia based gyros), thereby reducing the related forces, moments, and torques that are generated in the presence of high acceleration levels, i.e., when the accelerometer and gyro experiences shock or impact loading. Hereinafter and for the sake of simplicity and since the disclosed locking mechanisms apply equally to both accelerometers and inertia based gyros of various type, all such sensors are referred to as accelerometers. In general stops are also provided in the path of the moving component(s) of the accelerometer to limit its maximum deflection to protect such components from failure. The introduction of MEMS technology in recent years has made it possible to reduce the size of the proof mass significantly, independent of the accelerometer type and its mechanism of operation. All existing accelerometer designs, however, generally suffer from the following operational and/or performance deficiencies.

The most important shortcoming results from the reduction of the size of the proof mass since the sensitivity of an accelerometer is directly related to the relative size of its proof mass, even if the shape and design of the accelerometer structure is optimally selected. As a result, since highly accurate accelerometers are required for smart munitions guidance and control during their flight (sometimes resolutions in $1/100$ or even $1/1000$ of one G) and other similar applications, an accelerometer that can withstand tens of thousands of one G with a floating proof mass cannot be designed to provide such levels of precision.

Another major shortcoming is related to the significant amount of settling time required for the accelerometer to settle within an acceptable level following shock loading. Many types of sensors, particularly accelerometers, rely upon the deflection of one or more elastic structural elements of the sensor to make their sensory measurements. When subjected to firing setback or set-forward firing shock, which for a sensitive accelerometer or when the firing acceleration is high results in the proof mass to reach its travel limit at its (usually hard) stops, and generally impacting the stops. The sensor is thereby "saturated" and the mechanical energy stored in the sensor components in the form of potential energy in the elastic elements and kinetic energy in the proof mass and other elements of the sensor will cause the sensor structure to begin to vibrate following such impact events. The time until the vibration ceases or reduces to an acceptable value is referred to as a settling time. The settling time is particularly important for accelerometers used in guns or similarly fired projectiles and that are intended to be used for navigation and/or guidance and/or control purposes.

It is noted that accelerometers that are designed without proof mass travel limit stops and that can provide high sensitivity of the aforementioned order and that can tolerate high G shocks of the order of tens of thousands without permanent damage or change in their characteristics are yet to be conceived. This statement is also true for accelerometers with proof mass travel limit stops when subjected to high G shocks of over 30,000-50,000 Gs. This is the case since due to the nature of all proof mass based accelerometers, high sensitivity to low acceleration levels make them highly susceptible to shock loading damage since they rely on relatively large deformations to be induced in the accelerometer mechanism due to small input accelerations.

To alleviate the aforementioned shortcomings of proof mass based accelerometers and other similar inertia based sensors, active and passive mechanisms are disclosed in U.S. Pat. No. 6,626,040 that are used to lock the proof mass (and potentially other moving elements of the sensor) to the base structure of the sensor, preferably at its null position or near its (currently experienced) acceleration level, when the accelerometer is subjected to a shock with acceleration levels above a certain predetermined threshold. As a result, the proof mass and other moving elements of the sensor are protected from impacting their stops (or other elements of the sensor or its packaging if no strops are provided) and damaging the proof mass and/or other elements of the sensor. In addition, the generated dynamic forces acting on the proof mass and other elements of the sensor can better be distributed and supported.

In the above patent, the inventors disclose different embodiments for providing locking mechanisms for proof mass and other moving elements of inertia based sensors (hereinafter, all such mechanisms are referred to as simply "locking mechanisms"), particularly for accelerometers. These embodiments may be divided into the following two basic classes of locking mechanisms for proof mass and other moving elements of such inertia based sensors:

1—Active type of locking mechanisms: In this class of locking mechanisms, the means of actuating the locking elements is an active element such as an element that is powered electrically to generate a mechanical displacement and/or rotation.

2—Passive type of locking mechanisms: In this class of locking mechanisms, the means of actuating the locking elements is the dynamic force and/or torque and/or bending moment that is generated by the acceleration experienced by the sensor when the acceleration level (for example due to shock loading) reaches a predetermined level.

It is noted that in all the disclosed embodiments of the U.S. Pat. No. 6,626,040 the locking action is achieved by providing mechanical elements that would constrain the motion of one moving element relative to another moving or fixed (generally meant to mean the structure of the sensor) element.

The aforementioned class of active type of locking mechanisms, including those embodiments that are disclosed in the U.S. Pat. No. 6,626,040, has certain advantages over the aforementioned class of passive type of locking mechanisms. They class of active type of locking mechanisms, however, suffer from shortcomings that make them unsuitable for a large number of applications, including those of guided gun-fired munitions, mortars, rockets and the like. The main advantages of the class of active type of locking mechanisms include the following:

1—The locking action may be initiated based on any sensory stimuli and since certain electronics circuitry, logic and/or processing unit must be provided, a wide range of choices, including the use of certain algorithms becomes possible for initiating the locking action. In fact, the locking action may be initiated even before certain event occurs or is timed to occur. As a result, this class of locking mechanisms provides a high level of flexibility to the user.

2—When using the locking mechanism to protect the proof mass and other moving elements of an inertia-based sensor (device) from shock loading, this class of locking mechanisms can provide the means to lock the proof mass and other moving elements of the sensor (device) irrespective of the direction of the shock loading. For example, when a round is fired by a gun, it is first subjected to firing (setback) acceleration inside the barrel and then to an opposite set-forward acceleration, which even though is usually a fraction of the setback acceleration (usually around 5-10 percent of the setback acceleration), but is still significantly higher than a desired threshold for locking the proof mass and other moving elements of a sensor to protection against damaged. The use of active locking mechanisms in sensors such as accelerometers used in gun-fired munitions, mortars and the like provides the means to lock the proof mass and other moving elements of the sensor during both setback and set-forward acceleration events.

The main shortcomings of the class of active type of locking mechanisms, including the shortcomings that make then unsuitable for most gun-fired munitions, mortars, rockets and the like, include the following:

1—Active locking mechanisms require event detection components such as sensors to detect the predetermined events, such a shock induced acceleration threshold, to trigger the actuation of the locking mechanism.

2—Active locking mechanisms require onboard electronics and/or logics circuitry and/or processing units for event detection to initiate the locking action or for timing such locking action initiation and to perform other related decision making activities.

3—Active locking mechanisms require actuation devices to operate. Such actuation devices are usually powered electrically, and may be designed to operate using the principles of electrical motors or solenoids, or active materials such as piezoelectric materials based elements.

4—In addition to requiring the aforementioned components to operate, active locking mechanisms also require electrical energy to power these devices. This requires the device using a sensor equipped with such active locking mechanism to be powered before an event that requires locking mechanism activation could occur. For munitions and other similar applications, this requirement translates to a need for onboard power sources to power sensor before launch. In addition, the total amount of power that required for the operation of the sensor becomes significantly higher than sensors equipped with passive locking mechanisms. The said requirement of electrical power availability prior to firing and/or the significantly higher power requirement as compared to sensors equipped with passive locking mechanisms make sensors equipped with active locking mechanisms undesirable for gun-fired munitions, mortars and the like applications.

5—In addition, devices using sensors equipped with locking mechanisms, particularly munitions, must also tolerate shock loading due to accidental events such as, for example, drops from up to 7 feet over concrete (hard) surfaces that can result in impact induced deceleration levels of up to 2,000 G. This means that devices using sensors equipped with active locking mechanisms cannot rely on their locking mechanisms to protect the proof mass and other moving elements of the sensor against such accidental drops since munitions cannot be powered at all times, even during assembly, transportation and storage. This in turn means that such sensors have to be provided with smaller proof mass to allow then to survive such accidental drops, i.e., their sensitivity has to be limited to prevent being damaged during such accidental drops.

The embodiments of the class of passive type of locking mechanisms disclosed in the U.S. Pat. No. 6,626,040, however, do not suffer from the above shortcomings of the class of active type of locking mechanisms, including the embodiments disclosed in the said patent. The said embodiments of class of passive type of locking mechanisms, however, suffer from the following shortcomings that make them undesirable for a large number of applications, including those of guided gun-fired munitions, mortars, rockets and the like:

1—For gun-fired munitions, mortars and the like, the embodiments of the class of passive type of locking mechanisms disclosed in the U.S. Pat. No. 6,626,040 provide protection to the proof mass and other moving components of the sensor against shock loading generated by the firing (setback) acceleration only and not against the set-forward acceleration which is in the opposite direction to the setback acceleration.

2—Similarly, in case of accidental drops, the proof mass and other moving components of the sensors are protected only if the device impacts a hard surface in the direction causing sensor acceleration in the direction of the firing setback acceleration. Otherwise if the impact occurs on the opposite side of the device, i.e., if the impact induced acceleration of the sensor is in the direction of the set-forward acceleration, then the proof mass and other moving components of the sensors are no longer protected against the impact induced shock.

The aforementioned class of passive locking mechanisms taught in the U.S. Pat. No. 6,626,040 and its aforementioned shortcomings are best described the embodiment of FIGS. 1a and 1b of the said patent. Referring now to FIGS. 1a and 1b, there is an accelerometer 100 shown schematically therein, which is intended to measure acceleration a in the direction 101. The accelerometer consists of a proof mass 102 which is rigidly attached to a relatively rigid base 106 (plate), a cantilever (bending) type of elastic element 103 with an equivalent spring rate k at the location of the proof mass 102 and in the direction of the acceleration 101. The proof mass 102 (with mass m) is located a distance 104 (with length l) from the base 105 to which the elastic beam element 103 is rigidly attached. In most MEMS types of accelerometers, the displacing plate 106 forms one side of a capacitor while the other capacitor plate (not shown) is rigidly attached to the base 105. This capacitor will then form the sensor that measures the elastic displacement of the proof mass due to the acceleration in the direction 101.

The basic proof mass locking mechanism of this embodiment consists of locking a first locking mass 108 which is attached to the base 105 by spring 107 on one side and locking a second locking mass 109 and spring 110 on the opposite side of the proof mass base plate 106. The second locking mass 109 is attached to a lever arm 111, which is hinged to the base 105 by the rotational joint 113. The spring 110 is attached to the base 105 on one end and to the lever arm 111 on the other. Opposite to the second locking mass 109 is positioned a moment mass 112 which provides a moment about the hinge joint 113 when the sensor is accelerated in the direction of the arrow 101. The moment mass 112 has a greater mass than that provided by the first locking mass 109, thereby it tends to move the first locking mass 109 upwards due to the acceleration in the direction 101.

The spring rates of the springs 107 and 110 are selected such that at the desired acceleration levels the gap between the first and second locking masses 109 and 108 and the plate 106 begin to close. A spaced locking stop 114 is located along the plate 106 to lock the plate 106 at the level dictated by the position of the locking stop 114. As a result, when the acceleration in the direction 101 reaches the selected level, the first and second locking masses 109 and 108 close the aforementioned gap, and thereby hold the base 106 and the proof mass 102 stationary at its null point, as shown in FIG. 1b.

In general, the springs 107 and 110 are preferably preloaded, i.e., provide a preset force in the direction of providing the required gap between themselves and the plate 106, and as the acceleration level reaches the desired maximum level, they will begin to close the gap. A basic mechanism to lock the proof mass 102 and/or other moving components of an accelerometer is described above using an elastic beam type of accelerometer. The design, however, can be seen to be applicable to almost all accelerometer and inertia based gyro designs, particularly those constructed using MEMS technology, such as those employing a linear displacement, a ring type, and a torsional type of accelerometers or gyros.

The basic proof mass locking mechanism taught in the U.S. Pat. No. 6,626,040, FIGS. 1a and 1b, is thereby seen to be capable of locking the proof mass to the base structure of the sensor when the shock acceleration experienced by the sensor is in the direction of the arrow 101 but not in its opposite direction. For example, if the sensor is used in gun-fired munitions, the locking mechanism can be designed to protect the sensor from the firing setback acceleration, but the generally significant set-forward acceleration of the said munitions experienced as the projectile exits the gun barrel can still damage the sensor. The sensor may similarly experience impact induced shock accelerations from two opposite directions similar to setback and set-forwards accelerations due to accidental drops.

SUMMARY OF THE INVENTION

Thus, considering the aforementioned advantages of passive type of locking mechanisms for inertia based sensors such as accelerometers, it is highly desirable to develop methods and means to provide such sensor with passive type of locking mechanisms that lock the proof mass and other moving elements of the sensor when subjected to shock loading from almost any direction. For the particular case of inertia based sensors such as accelerometers to be used in guided gun-fired munitions, mortars, rockets and the like, it is highly desirable that passive type of locking mechanisms be developed that could lock the proof mass and other moving parts of the sensor when it is subjected to both firing setback acceleration as well as firing set-forward acceleration. Inertia based sensors equipped with such passive type of locking mechanisms will have all the advantages of the embodiments of the class of passive type of locking mechanisms disclosed in the U.S. Pat. No. 6,626,040, but will not suffer from their aforementioned shortcoming. The same locking mechanisms may also be used to provide protection to inertia based gyros of various types (such as those disclosed in U.S. Pat. Nos. 4,598,585 or 5,203,208 or 5,488,862 or 6,009,751) by providing the means to lock inertia members and other moving elements of the gyro to the base structure of the sensor when the experienced acceleration levels (both linear and rotational acceleration levels, such as those due to the firing setback and set-forward acceleration levels and/or those generated due to accidental drops) go beyond certain predetermined threshold. As a result, such gyros can be designed with larger (higher inertia) elements, thereby rendering them significantly more sensitive and with significantly reduced settling time, while protected from damage due to accidental drops and for the case of gun-fired munitions, mortars, rockets and the like due to firing (setback) and set-forwards accelerations.

A need therefore exists in the art for sensors, in particularly accelerometers, which are sensitive enough to provide accurate sensing of a desired parameter, such as acceleration, yet rugged enough to withstand shock loading due to an external stimulus such as a high-G accelerations experienced by gun-fired munitions, mortars, rockets, and the like during firing (setback acceleration), during set-forward acceleration, and even during accidental drops over hard surfaces. For the particular case of gun-fired munitions, mortars, rockets, and the like, i.e., for applications in which one or more of the aforementioned shortcomings of active types of locking mechanisms for the protection of the sensor proof mass and its moving components against shock loading makes then unsuitable, the provided locking mechanisms have to be of passive type.

A need therefore exists in the art for passive types of locking mechanisms to protect proof mass and other moving elements of inertia based sensors such as accelerometers and gyros against shock loading from more than one direction to allow the sensors to be provided with significantly larger proof masses to significantly increase their sensitivity. Furthermore, there is a need in the art for sensors, in particularly accelerometers and gyros, in which the settling time of a deflected member is minimized.

Therefore it is an object to provide inertia based sensor with passive locking mechanisms that would protect the sensor proof mass and other moving elements against shock loading from multiple directions.

It is another object to provide the methods of developing such passive locking mechanisms for inertia based sensors for protecting them against shock loading from multiple directions.

In particular, it is an object to provide accelerometers and other similar inertia based sensors that are equipped with passive locking mechanisms that would protects the sensor proof mass and other moving elements against shock loading from multiple directions, particularly for protecting such accelerometers and inertia based sensors used in gun-fired munitions, mortars and rockets from firing setback acceleration as well as firing set-forward acceleration as well as shock loading due to accidental drops.

Accordingly, a sensor is provided. The sensor comprising: a base; at least one component which moves relative to the base; and one or more locking mechanisms for locking the at least one component in a predetermined stationary position in response to external stimuli exceeding predetermined thresholds in at least first and second directions, where the first direction is different from the second direction.

The sensor can be selected from a group consisting of an accelerometer and an inertial gyro. The external stimuli can be first and second accelerations of the sensor, the first acceleration being a setback acceleration in the first direction and the second acceleration being a set forward acceleration in the second direction.

The at least one component can be a proof mass mounted to a deformable member.

The one or more locking mechanisms can comprise a first sub-mechanism for locking the at least one component in the predetermined stationary position in response to the external stimuli exceeding a first predetermined threshold in the first direction and a second sub-mechanism for locking the at least one component in the predetermined stationary position in response to the external stimulus exceeding a second predetermined threshold in the second direction.

The one or more locking mechanisms can comprise a single mechanism for locking the at least one component in the predetermined stationary position in response to the external stimuli exceeding the predetermined thresholds in both the first and second directions.

The one or more locking mechanisms can engage the at least one component in rotation to lock the at least one component in the predetermined stationary position.

The one or more locking mechanisms can engage the at least one component in translation to lock the at least one component in the predetermined stationary position.

The one or more locking mechanisms can be a first locking mechanism and the sensor can further comprise a second locking mechanism for one of locking or unlocking the first locking mechanism upon the occurrence of a predetermined external stimulus.

At least one of the external stimuli can be a rotational acceleration.

Also provided is a sensor comprising: a base; at least one component which moves relative to the base; and one or more locking means for locking the at least one component in a predetermined stationary position in response to external stimuli exceeding predetermined thresholds in at least first and second directions, where the first direction is different from the second direction.

Still further provided is a method for passively hardening a sensor from external stimuli greater than predetermined thresholds. The method comprising: protecting one or more of a moving part and mechanism of the sensor from a first external stimulus in a first direction or minimizing residual vibration of the one or more moving part and mechanism from the first stimulus in the first direction; and protecting the one or more of a moving part and mechanism of the sensor from a second external stimulus in a second direction or minimizing residual vibration of the one or more moving part and mechanism from the second stimulus in the second direction; wherein one or more of the first and second stimuli or first and second directions are different.

The protecting steps can comprise one or more of locking the one or more of the moving part and mechanism to a base structure of the sensor or minimizing elastic deformation of the moving part and mechanism.

The external stimuli can be acceleration of the sensor and the first stimulus can be a setback acceleration in the first direction and the second stimulus can be a set forward acceleration in the second direction.

The protecting steps can be carried out by separate mechanisms. One or more of the separate mechanisms can engage the moving part or mechanism in rotation to lock the moving part or mechanism in a predetermined stationary position. One or more of the separate mechanisms can engage the moving part or mechanism in translation to lock the moving part or mechanism in a predetermined stationary position.

The protecting steps can be carried out by a same mechanism. The same mechanism can engage the moving part or mechanism in rotation to lock the moving part or mechanism in a predetermined stationary position. The same mechanism can engage the moving part or mechanism in translation to lock the moving part or mechanism in a predetermined stationary position.

The protecting steps can be carried out by one or more first mechanisms and the method can further comprise providing a second locking mechanism for one of locking or unlocking the one or more of the first locking mechanisms upon the occurrence of a predetermined external stimulus.

At least one of the first external stimulus and second external stimulus can be a rotational acceleration.

BRIEF DESCRIPTION OF THE DRAWINGS

These and other features, aspects, and advantages of the apparatus and methods of the present invention will become better understood with regard to the following description, appended claims, and accompanying drawings where:

FIG. 1a illustrates a schematic diagram of an accelerometer sensor taught in prior art having a passive means for locking the proof mass in a null position during periods of high acceleration in a single direction.

FIG. 1b illustrates the schematic of FIG. 1a in which the proof mass is locked in the null position.

FIGS. 11a and 11b illustrate the schematic of one embodiment of the mechanism for locking the keeping the proof mass locked to the base structure of the sensor in normal conditions.

DETAILED DESCRIPTION OF THE PREFERRED EMBODIMENT

Figure 2A:
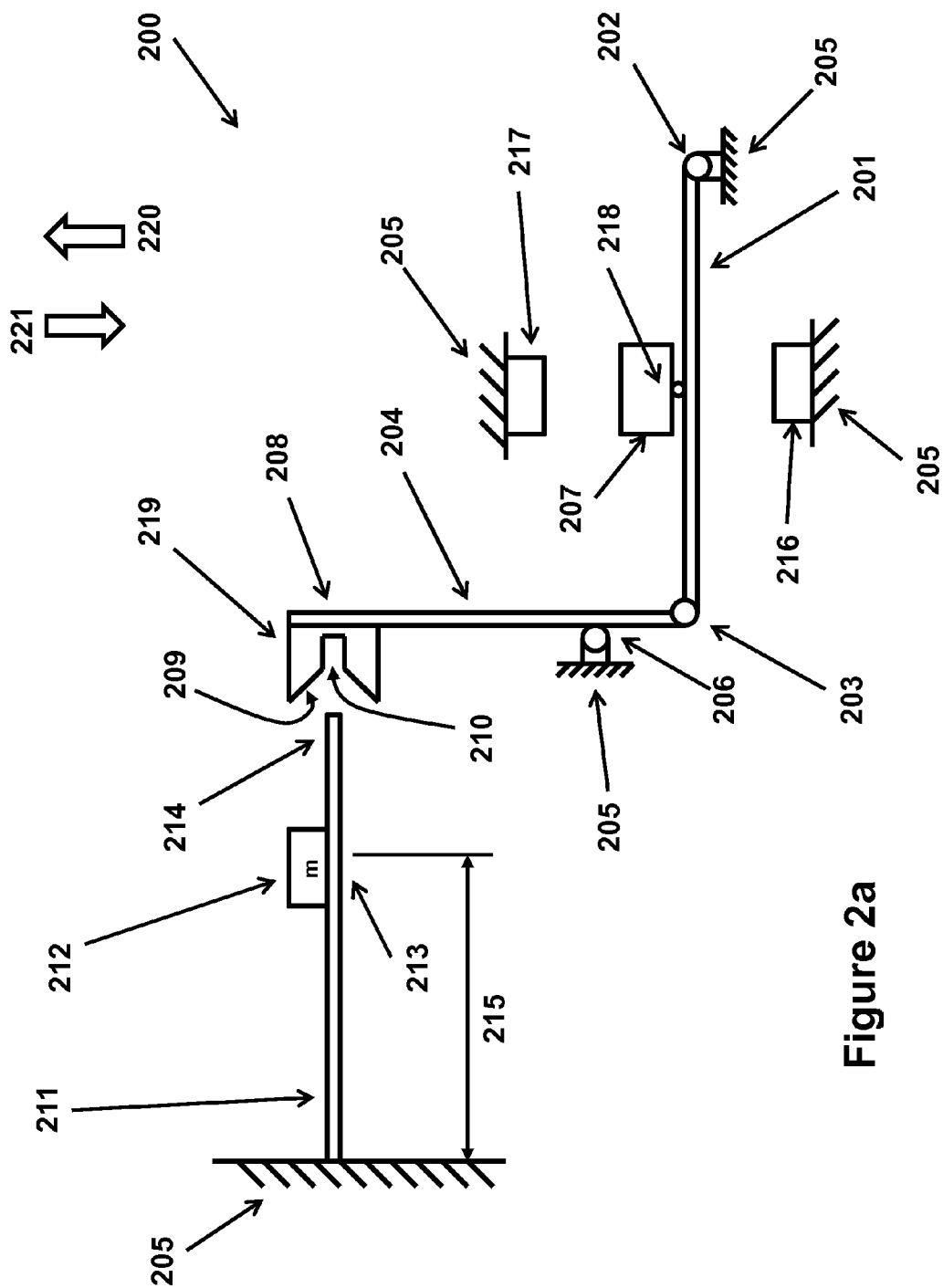
FIG. 2a illustrates a schematic diagram of an accelerometer sensor having a passive means for locking the proof mass in a null position during periods of up or down accelerations above a predetermined threshold.

Although this invention is applicable to numerous and various types of sensors and external stimulus, it has been found particularly useful in the environment of accelerometers and inertia based gyros and acceleration stimulus. Therefore, without limiting the applicability of the invention to accelerometers and gyros and acceleration stimulus, the invention will be described in such environment.

In summary, the inertia based sensors provide a general method of passively hardening various sensors with moving parts and/or with significant structural flexibility (compared to their base structure), particularly for application in devices that are susceptible to shock loading from different directions, residual vibration as the result of shock or similar high acceleration loading such as accidental drops. In particular, for munitions applications, such as for gun-fired munitions and mortars, there is provided sensors such as accelerometers and inertia based gyros that that are not only hardened against shock loading due to accidental drops and firing setback and set-forward accelerations, but by allowing the proof mass (inertia) and moving elements of the sensors to be locked to the sensor base structure when such acceleration levels are beyond certain predetermined threshold, the size of the proof mass (inertia) elements can be significantly increased, thereby also significantly increasing sensitivity of such inertia based sensors. The method by which this is achieved is applicable to all such sensors, but is of particular importance for devices, such as sensors, such as accelerometers and inertia based gyros, actuators and the like that are desired to be light weight therefore structurally flexible or are required to be light weight or highly deformable (flexible) or have movable parts for their proper operation or to render them highly sensitive to the input to be measured such as for the case of almost all accelerometers and/or inertia based gyros, such as inertia measurement units (IMUs).

In the context of the present invention, hardening is meant to refer to the following functions: (1) Provision of means to protect the moving parts and various mechanisms of the sensor from physical short term or permanent damage and/or (2) To minimize or effectively eliminate residual vibration of the components of the sensor that would require time to settle before the device could begin or resume its normal operation. The residual vibration is generally due to the elastic deformation of one or more movable components of the sensor and result in a certain amount of potential energy to be stored in these components during shock loading and would cause residual vibration until it is absorbed (damped) by passive or active means.

The disclosed embodiments for MEMS accelerometers and inertia based gyros are general in design and are applicable to all basic designs that include elastic and/or moving elements, e.g., all those based on torsional deformation, bending deformation, axial deformation and their various combinations.

The basic operation of the various embodiments of the sensors is based on locking one or more moving components of the sensor to a relatively rigid base structure of the sensor (accelerometer or inertia based gyro) during the period(s) in which the sensor experiences shock loading that is beyond certain predetermined threshold. In an accelerometer, this moving component is referred to as a proof mass (and/or other moving components of the accelerometer to which the proof mass is rigidly attached). In the embodiments, the locking or braking action of the moving component and the mechanism of its operation may be described as being passive, i.e., require no external power and its operation is automatically triggered when the acceleration levels reach certain preset levels. A difference between the embodiments disclosed and those disclosed in previous art (the U.S. Pat. No. 6,626,040) is that the embodiments disclosed in the prior art can protect the proof mass and moving parts of the sensor from high acceleration levels (shock loading) applied from only one direction (such as only from the firing setback acceleration and not from the firing set-forward acceleration for the case of gun-fired munitions, mortars and the like), thereby making them undesirable for applications such as for munitions applications. In contrast, however, the embodiments can protect the proof mass and other moving components of the sensor from multi-directional shock, such as from the firing setback acceleration as well as from the firing set-forward acceleration for the case of gun-fired munitions, mortars and the like, thereby making them highly suitable for such munitions applications.

In addition, the locking mechanism may have the means to lock the proof mass or the aforementioned moving component(s) to which it is rigidly attached, at a predetermined position corresponding to an acceleration offset, usually at a level close to the level at which the acceleration measurements have to be resumed following unlocking of the proof mass or the aforementioned moving component(s). The offset may be programmable into the sensor, in which case external power would generally be required to activate some actuation means to affect and/or vary the offset level. The offset may also be actively set or built into the sensor, in which case external power is not required to put it into effect.

In the following description, the aforementioned sensors and methods of hardening the sensors and the various embodiments of their application are described in terms of accelerometers in general, and those designed to be produced using MEMS (microelectromechanical devices) technology in particular. However, it can be appreciated by those of ordinary skill in the art that the disclosed sensors and methods are readily applicable to all devices, such as various sensors and actuators with moving parts, particularly those constructed with flexible and/or moving elements for their proper operation or for reasons such as to reduce weight (mass or inertia). The sensors and methods are at least partly used to provide the means to lock or brake the primary moving components of various sensors that are subject to shock loading to protect them from damage during shock loading and where appropriate, to minimize residual vibration and settling time.

A first embodiment 200 is shown in the schematic drawing of FIG. 2a. The accelerometer 200 shown schematically therein, is intended to measure acceleration in directions 220 and 221. The accelerometer 200 consists of a proof mass 212 which is rigidly attached to a relatively rigid base 213 (plate), a cantilever (bending) type of elastic element 211 with an equivalent spring rate k at the location of the proof mass 212 and in the direction of the acceleration 220 (221). The proof mass 212 (with mass m) is located a distance 215 (with length l) from the base 205 to which the elastic beam element 211 is rigidly attached. In most MEMS types of accelerometers, the displacing plate 213 forms one side of a capacitor while the other capacitor plate (not shown) is rigidly attached to the base 205. This capacitor will then form the sensor that measures the elastic displacement of the proof mass due to the acceleration in the directions 220 and 221.

The basic mechanism for the aforementioned locking of the proof mass 212 consists of a mass 207 which is attached close to the mid-point of a flexible beam 201, preferably by a hinge joint 218. The flexible beam 201 is fixed to the base structure of the sensor 205, such as by a hinge joint 202 on one side and to a relatively rigid link 204 by a hinge joint 203. The relatively rigid link 204 is in turn attached to the base structure of the sensor 205 by a hinge joint 206. The hinge joints 202, 203 and 206 can be conventional hinges or living joints. The means of locking the proof mass 212 during high acceleration events (accelerations being in the direction indicated by the arrow 220 or the arrow 221) comprises a member 219, which is fixed to an end 208 of the link 204. The member 219 can have a u-shaped mouth 210 with a tapered leading edge 209 to capture an edge 214 or other portion of the plate 211 when it is to be essentially locked to the base structure 205 of the sensor 200.

Figure 2B:
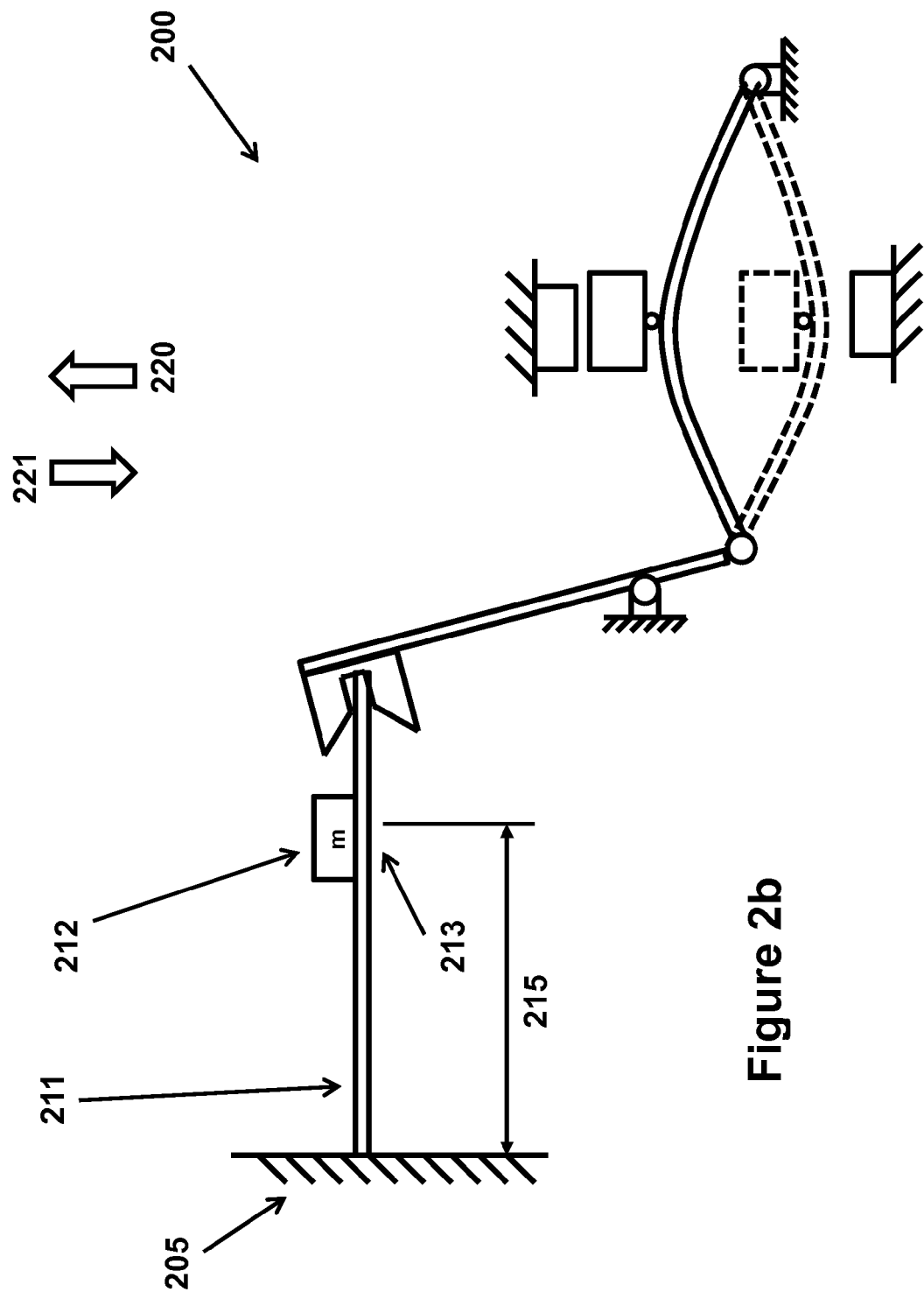
FIG. 2b illustrates the schematic of FIG. 2a in which the proof mass is locked in the null position.

If the sensor 200 is subjected to a high acceleration level in the direction of the arrow 220 (221), the dynamic force resulting from the action of the acceleration on the inertia (mass) of the element 207 will deflect the beam 201 downward (upward) as shown by solid lines in FIG. 2b (shown by dotted lines in FIG. 2b), thereby causing the link 204 to rotate in the counter-clockwise direction, thereby moving the locking member 219 into position to engage the edge 214 of the plate 211 and essentially locking the plate 211 to the base structure of the sensor 205 as shown in FIG. 2b.

In general, the flexible beam 201 is preferably provided with stops 216 and 217 to protect the beam 201 from bending beyond the required levels. The bending stiffness of the flexible beam 201 is also preferably selected such that at the aforementioned predetermined acceleration thresholds, the upward or downward bending of the flexible beam would position the locking member 219 in the position to engage the edge 214 of the plate 211. In addition, preloaded spring elements (not shown) may also be provided between the flexible beam 201 and the base structure of the sensor 205 that have to be overcome before the flexible beam 201 would begin to deflect.

The locking mechanism of the embodiment of FIGS. 2a and 2b is thereby shown to be capable of operating to lock the proof mass or other moving components of a sensor when the sensor is subjected to acceleration levels above certain thresholds, irrespective of its sense (in the case of the sensor of FIGS. 2a and 2b, if the acceleration is in either 220 or 221 direction).

Figure 3A:
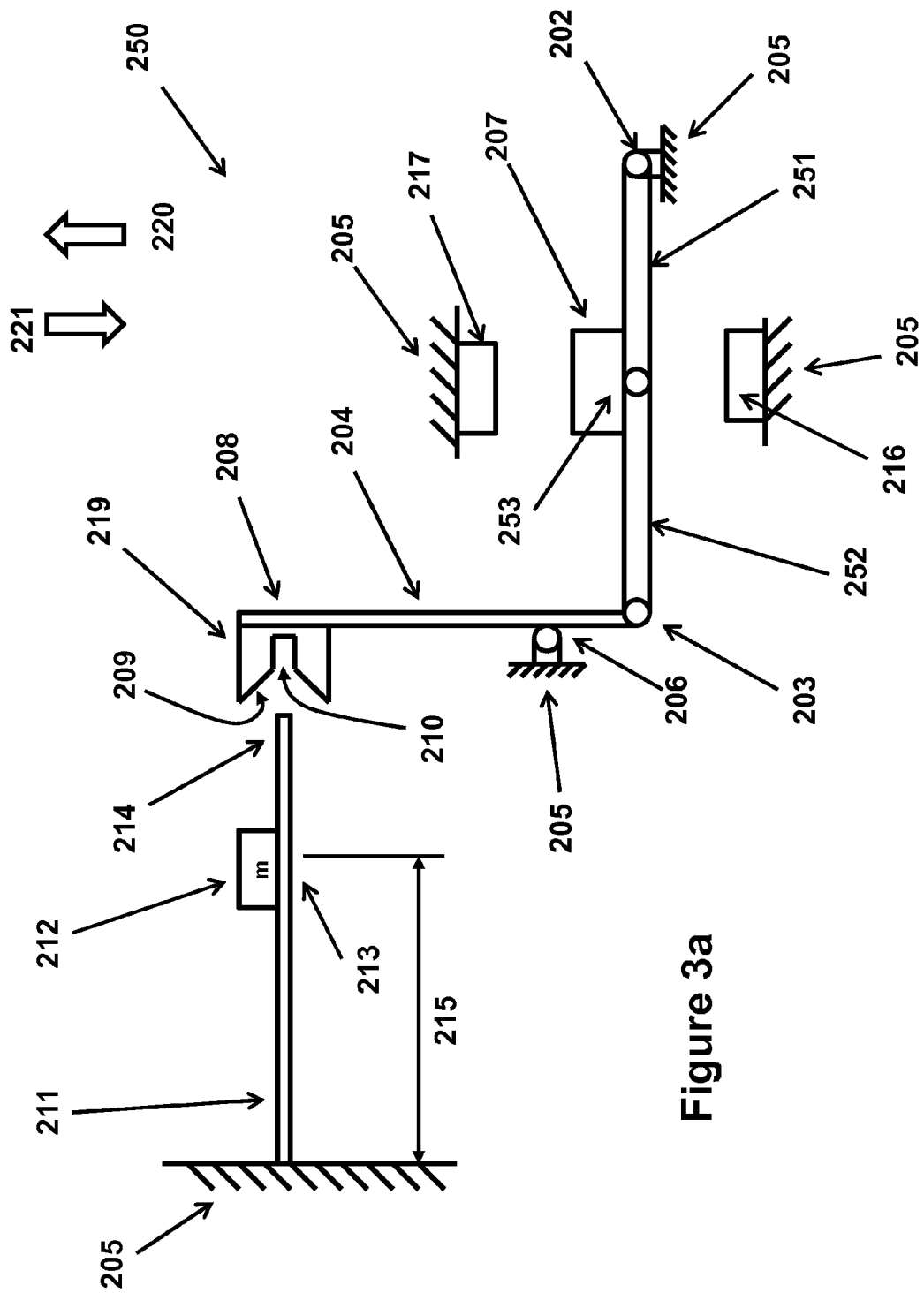
FIG. 3a illustrated the schematic of another accelerometer sensor embodiment having a passive means for locking the proof mass in a null position during periods of up or down accelerations above a predetermined threshold.

In an alternative embodiment 250 shown in FIG. 3a, the flexible beam 201 of the embodiment 200 shown in FIG. 2a is replaced with two relatively rigid links 251 and 252. In the schematic of FIG. 3a, all other members of the embodiment 250 are identical to those of the embodiment 200 of FIG. 2a. The link 251 is similarly attached on one end to the base structure of the sensor 205 by the hinge joint 202 and on the other end by the hinge joint 253 to the link 252. The other end of the link 252 is attached to the link 204 by the hinge joint 203. The mass element 217 in then preferably attached directly to the hinge joint 253 (instead of the hinge joint 218 in the embodiment 200 of FIG. 2a). The relatively rigid links 251 and 252 are provided with preloaded torsion springs at the joint 253 (preferably a pair of opposing preloaded torsion springs—not shown) to bias the beams 251 and 252 to stay at or near their collinear configuration as shown in FIG. 3a. In kinematics theory, this collinear configuration of the two links 251 and 252 is known as their singular position, the use of which has been shown to be the only way of obtaining a single positioning (single direction of displacement or rotation of a link (in the case of the embodiment of FIG. 3a, the counter-clockwise rotation of the link 204) for two opposite displacements or rotations of an input link (in the case of the embodiment of FIG. 3a, the clockwise and counter-clockwise rotation of the link 251—in this case caused by the accelerations in the directions 221 and 220, respectively, acting on the mass element 207).

Figure 3B:
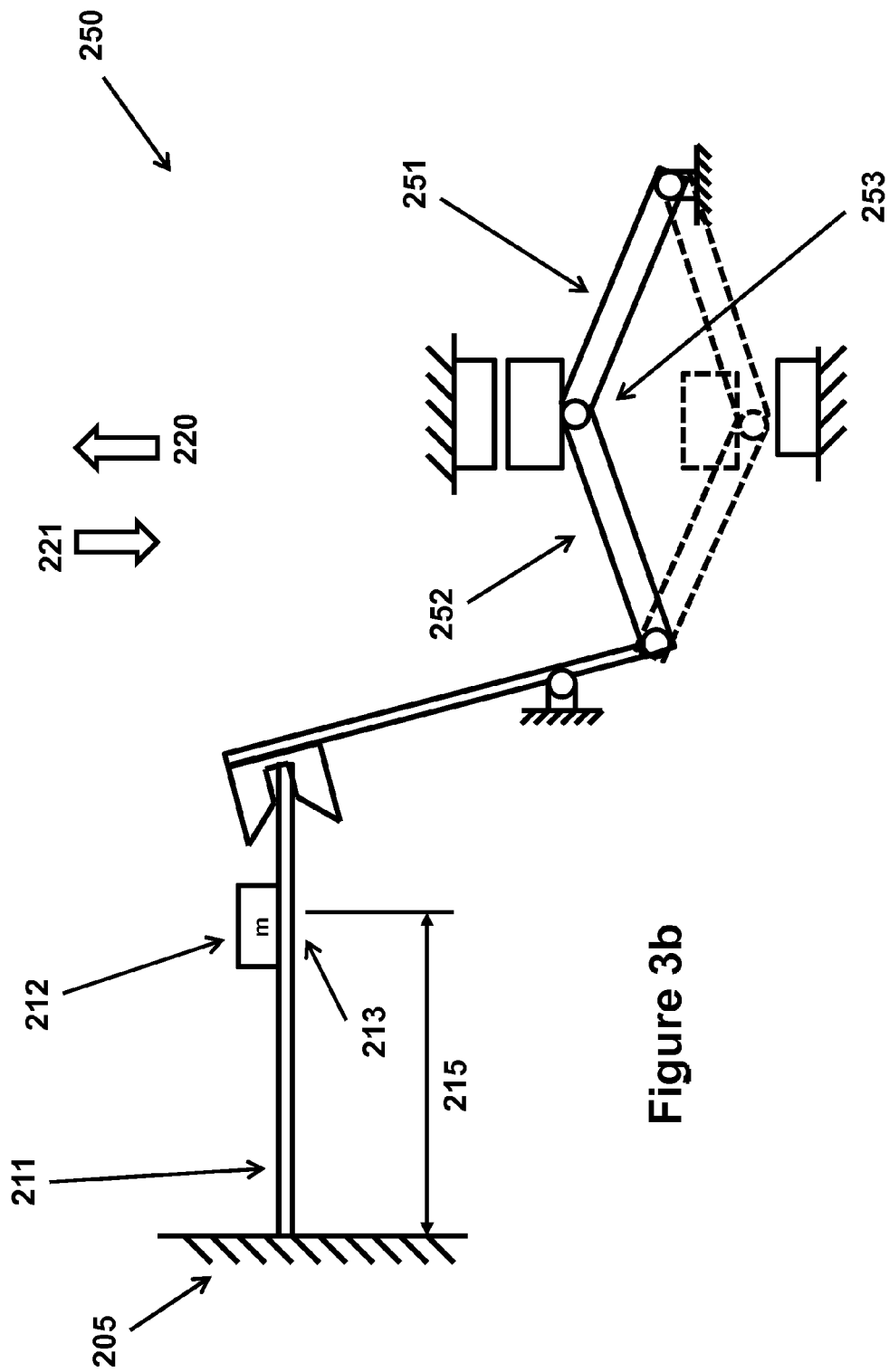
FIG. 3b illustrates the schematic of FIG. 3a in which the proof mass is locked in the null position.

Now if the sensor is subjected to a high acceleration level in the direction of the arrow 220 (221), the dynamic force resulting from the action of the said acceleration on the inertia (mass) of the element 207 will cause the element 207 (thereby the joint 253 of the links 251 and 252) to be displaced downward (upward) as shown by solid lines in FIG. 3b (shown by dotted lines in FIG. 3b), thereby causing the link 204 to rotate in the counter-clockwise direction, thereby moving the locking member 219 into position to engage the edge 214 of the plate 211 and essentially locking the plate 211 to the base structure of the sensor 205 as shown in FIG. 3b.

In general, the assembly of links 251 and 252 can be provided with stops 216 and 217 to protect the assembly from displacing beyond the required levels. The net torsional spring rate and the preloading level of the aforementioned torsion springs at the joint 253 can also be selected such that at the aforementioned predetermined acceleration thresholds, the upward or downward displacement of the joint 253 would position the locking member 219 in the position to engage the edge 214 of the plate 211. In addition, preloaded torsion spring elements (not shown) may also be provided with different preload levels (generally providing a corresponding initial upward or downward displacement of the joint 253) so that the acceleration threshold level that results in the engagement of the locking member 219 with the edge 214 of the plate 211 is selectively different for acceleration in the upward direction (i.e., the direction of the arrow 220) and acceleration in the downward direction (i.e., the direction of the arrow 221).

A basic mechanism to lock the proof mass 212 and/or other moving components of an accelerometer is described above for the embodiments of FIGS. 2a and 3a. The design, however, can be seen to be applicable to almost all accelerometer and inertia based gyro designs, particularly those constructed using MEMS technology.

Those skilled in the art will appreciate that a number of variations of the designs that are illustrated in FIGS. 2a and 3a may also be utilized for the construction of the locking mechanism. The only requirement of such locking mechanisms is that for both up or down motion of the locking action initiating mass element (in the case of the embodiment of FIG. 2a, the mass 207), the locking member (in the case of the embodiment of FIG. 2a, the member 219) move in the same direction, i.e., the direction to engage the proof mass or other moving components of the sensor.

Figure 4A:
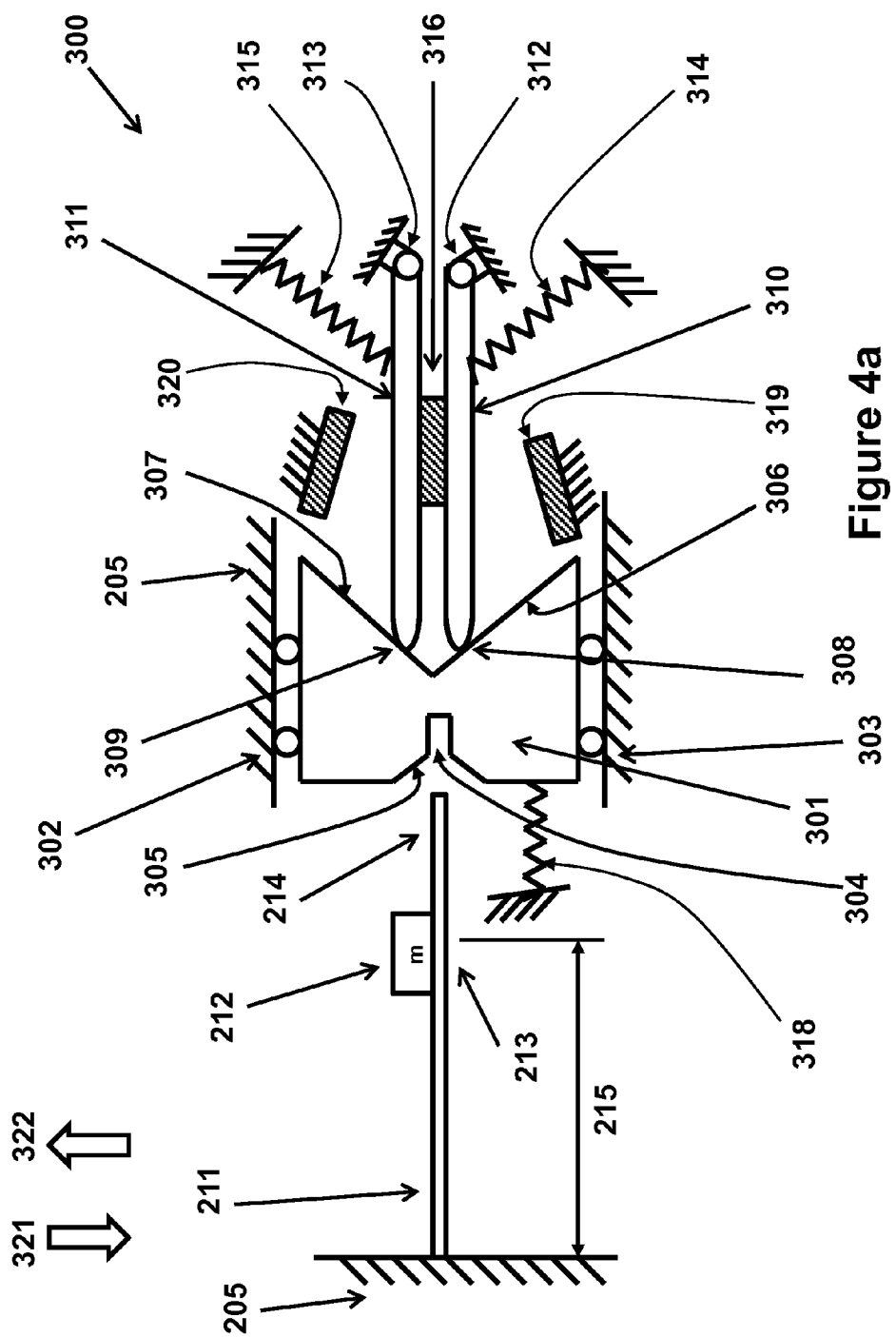
FIG. 4a illustrated the schematic of another accelerometer sensor embodiment having a passive means for locking the proof mass in a null position during periods of up or down accelerations above a predetermined threshold.

Another embodiment 300 is shown in the schematic of FIG. 4a. In the schematic of FIG. 4a, except for the locking mechanism portion described below, all other members of the embodiment 300 are identical to those of the embodiment 200 of FIG. 2a. In this embodiment 300, the locking mechanism consists of the locking member 301, which is positioned in a guide in which it can slide laterally as shown in FIG. 4a (in this schematic, the sliding members are shown as two sets of rollers 302 and 303 positioned on either side of the locking member 301), thereby forming a so-called sliding joint. The member 301 can be provided with a u-shaped mouth 304 having a tapered leading edge 305 to capture the edge 214 of the plate 211 when it is to be essentially locked to the base structure 205 of the sensor 300. The locking member 301 is provided with inclined surfaces 306 and 307. The locking mechanism is also provided with the relatively rigid links 310 and 311, which are attached to the base structure 205 of the sensor 300 by the hinge joints 312 and 313, respectively. The links 310 and 311 are provided with springs 314 and 315, which are both attached to the base structure of the sensor 205 on one end, and to the links 310 and 311, respectively, at the other end. The springs 314 and 315 are preloaded in compression, so that in normal conditions the links 310 and 311 are pressed against the stop 316. The stop 316 is attached to the base structure of the sensor 205. In the normal conditions shown by the configuration of FIG. 4a of the sensor 300, the locking member 301 is pushed back against the tips 308 and 309 of the links 310 and 311 by the spring element 318. It is noted that in the schematic of FIG. 4a, for clarity, a compressively preloaded spring 318 is shown to be used. However, a tensile spring can also be used instead which can be centrally positioned relative to the locking member 301. The links 310 and 311 can be provided with stops 319 and 320 to limit their rotation such that their tips 308 and 309 stays within the range of contact with the surfaces 306 and 307, respectively.

Figure 4B:
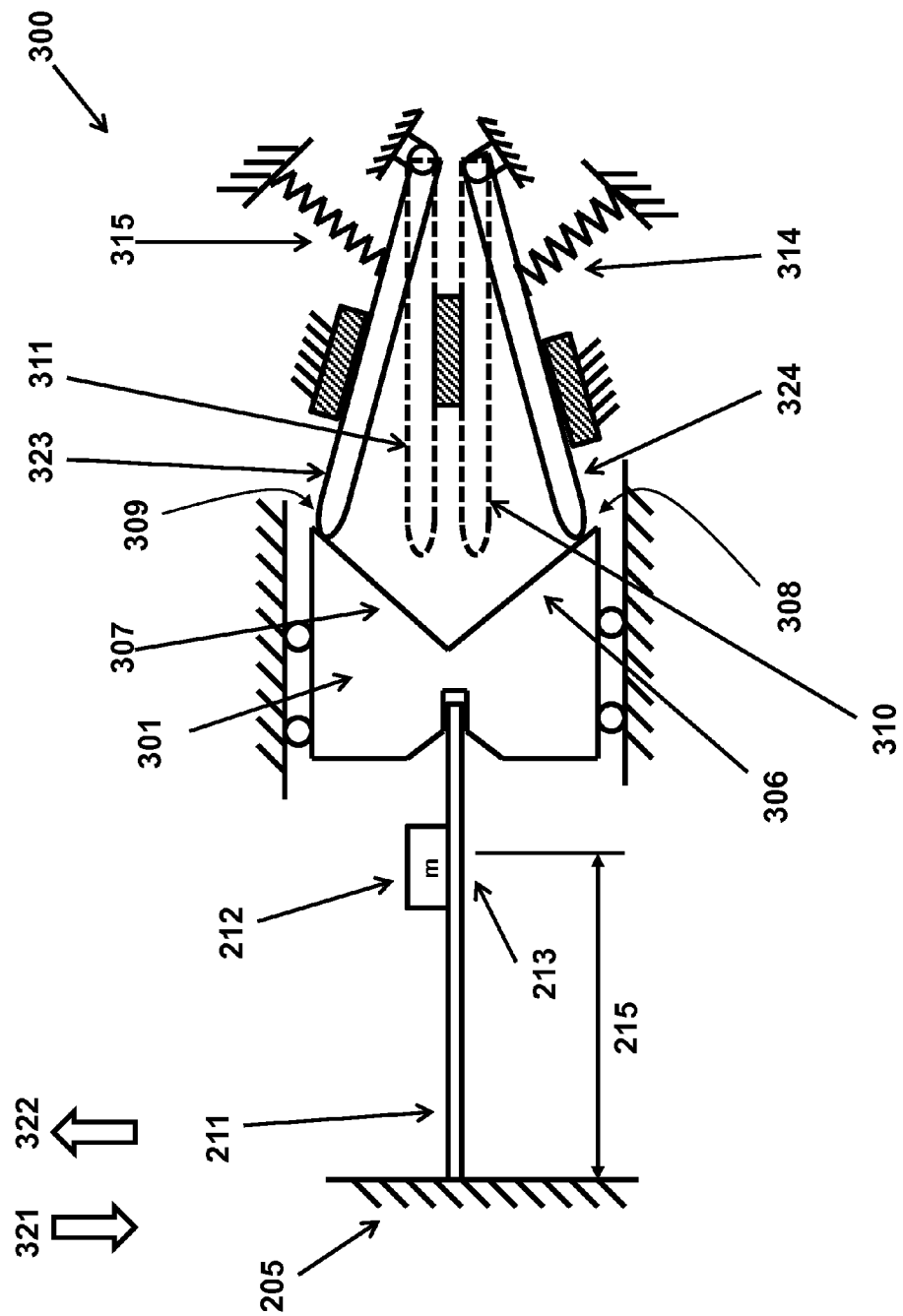
FIG. 4b illustrates the schematic of FIG. 4a in which the proof mass is locked in the null position.

Now if the sensor is subjected to a high acceleration level in the direction of the arrow 321, the dynamic force resulting from the action of the acceleration on the inertia of the link 311 (drawn with dotted lines in FIG. 4b) will generate a torque that if it is large enough to overcome the forces of the springs 315 and 318, would begin to rotate the link 311 in the clockwise direction. As a result, as the link 311 is rotated in the clockwise direction towards its uppermost position indicated by solid lines in FIG. 4b (enumerated in this position with the numeral 323), the tip 309 of the link 311 would push the locking member 301 into position to engage the edge 214 of the plate 211 and essentially locking the plate 211 to the base structure of the sensor 205 as shown in FIG. 4b. On the other hand, if the sensor is subjected to a high acceleration level in the direction of the arrow 322, the dynamic force resulting from the action of the said acceleration on the inertia of the link 310 (drawn with dotted lines in FIG. 4b) will generate a torque that if it is large enough to overcome the forces of the springs 314 and 318, would begin to rotate the link 310 in the counterclockwise direction. As a result, as the link 310 is rotated in the counterclockwise direction towards its lowermost position indicated by solid lines in FIG. 4b (enumerated in this position with the numeral 324), the tip 308 of the link 310 would push the locking member 301 into position to engage the edge 214 of the plate 211 and essentially locking the plate 211 to the base structure of the sensor 205 as shown in FIG. 4b.

Figure 5A:
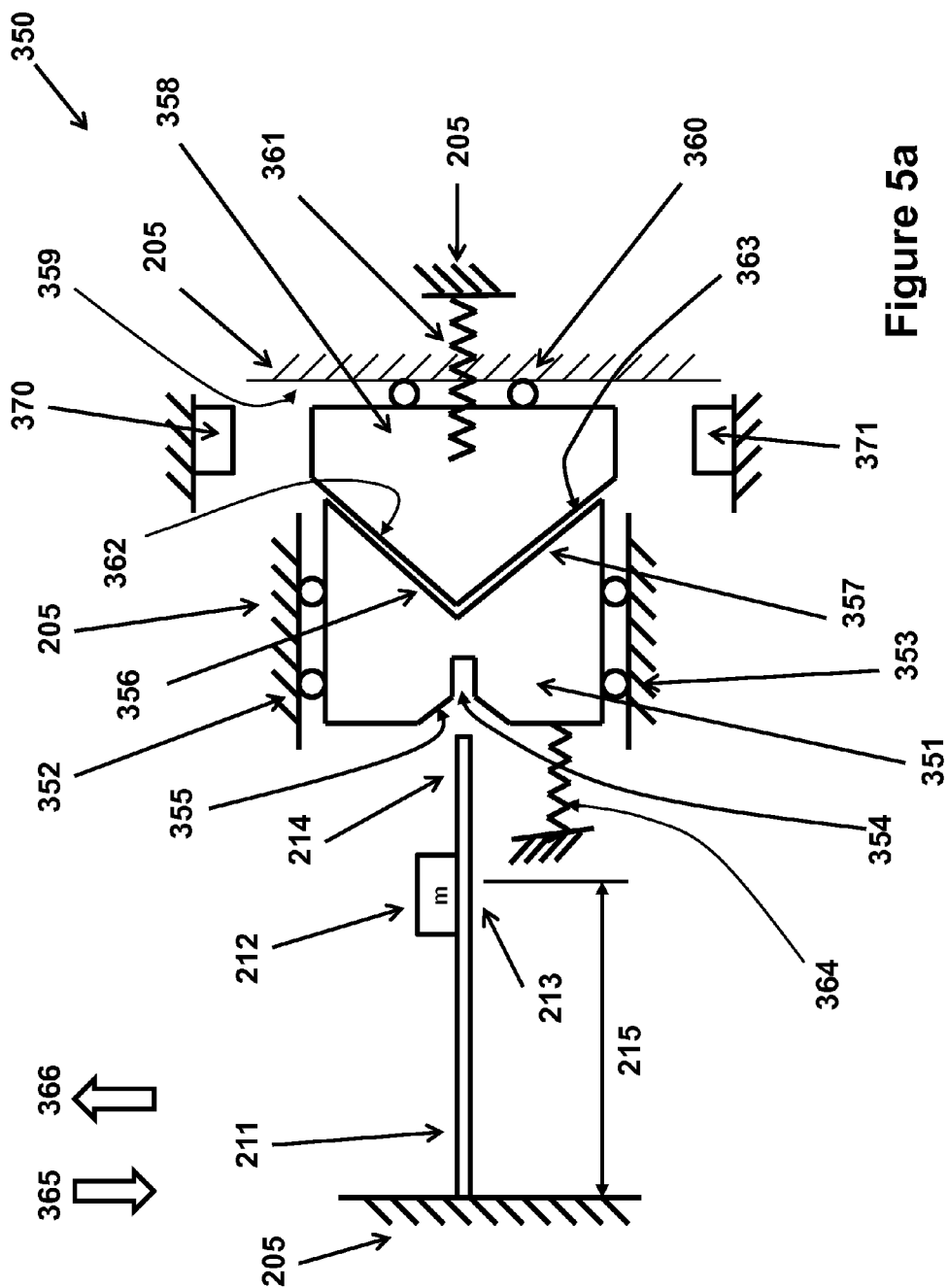
FIG. 5a illustrated the schematic of another accelerometer sensor embodiment having a passive means for locking the proof mass in a null position during periods of up or down accelerations above a predetermined threshold.

Another embodiment 350 is shown in the schematic of FIG. 5a. In the schematic of FIG. 5a, except for the locking mechanism portion described below, all other members of the embodiment 350 are identical to those of the embodiment 200 of FIG. 2a. In this embodiment 350, the locking mechanism consists of the locking member 351, which is positioned in a guide in which it can slide laterally as shown in FIG. 5a (in this schematic, the sliding members are shown as two sets of rollers 352 and 353 positioned on either side of the locking member 351), thereby forming a so-called sliding joint. The member 351 is provided with a u-shaped mouth 354 having a tapered leading edge 355 to capture the edge 214 of the plate 211 when it is to be essentially locked to the base structure 205 of the sensor 350. The locking member 351 is provided with inclined surfaces 356 and 357.

The locking member 351 is provided with a v-shaped portion indicated by its two surfaces 356 and 357 opposite to the u-shaped mouth 354. The locking mechanism is also provided with a relatively rigid member 358, which is free to slide up and down as shown in FIG. 5a over the surface 359 of the base structure of the sensor, if possible over rolling or other similar friction reduction elements 360. The member 358 is held in place by the spring element 361, which is attached to the member 358 on one side and to the base structure of the sensor on the other side, preferably by hinge joints (not shown). The spring element 361 is preferably preloaded in tension in the normal configuration of the sensor shown in FIG. 5a. The member 358 is provided with inclined surfaces 362 and 363 that matches the sides of the v-shaped surfaces 356 and 357, respectively, of the locking member 351 as shown in the schematic of FIG. 5a. In addition, stops 370 and 371 are preferably provided to limit up and down translation of the element 358 to prevent it from being disengaged from the locking member 351.

In the normal condition shown by the configuration of FIG. 5a of the sensor 350, the locking member 351 is pushed back against the member 358 by the spring element 364, bringing the surfaces 356 and 357 of the v-shaped portion of the locking member 351 in contact with the surfaces 362 and 362, respectively, of the element 358. The spring element 364 is attached to the base structure of the sensor 205 on one end and to the locking member 351 on the other. The spring element 364 can also be preloaded in compression. It is noted that in the schematic of FIG. 5a, for clarity, a compressively preloaded spring 364 is shown to be used. However, a tensile spring can also be used instead and can be centrally positioned relative to the locking member 351.

Figure 5B:
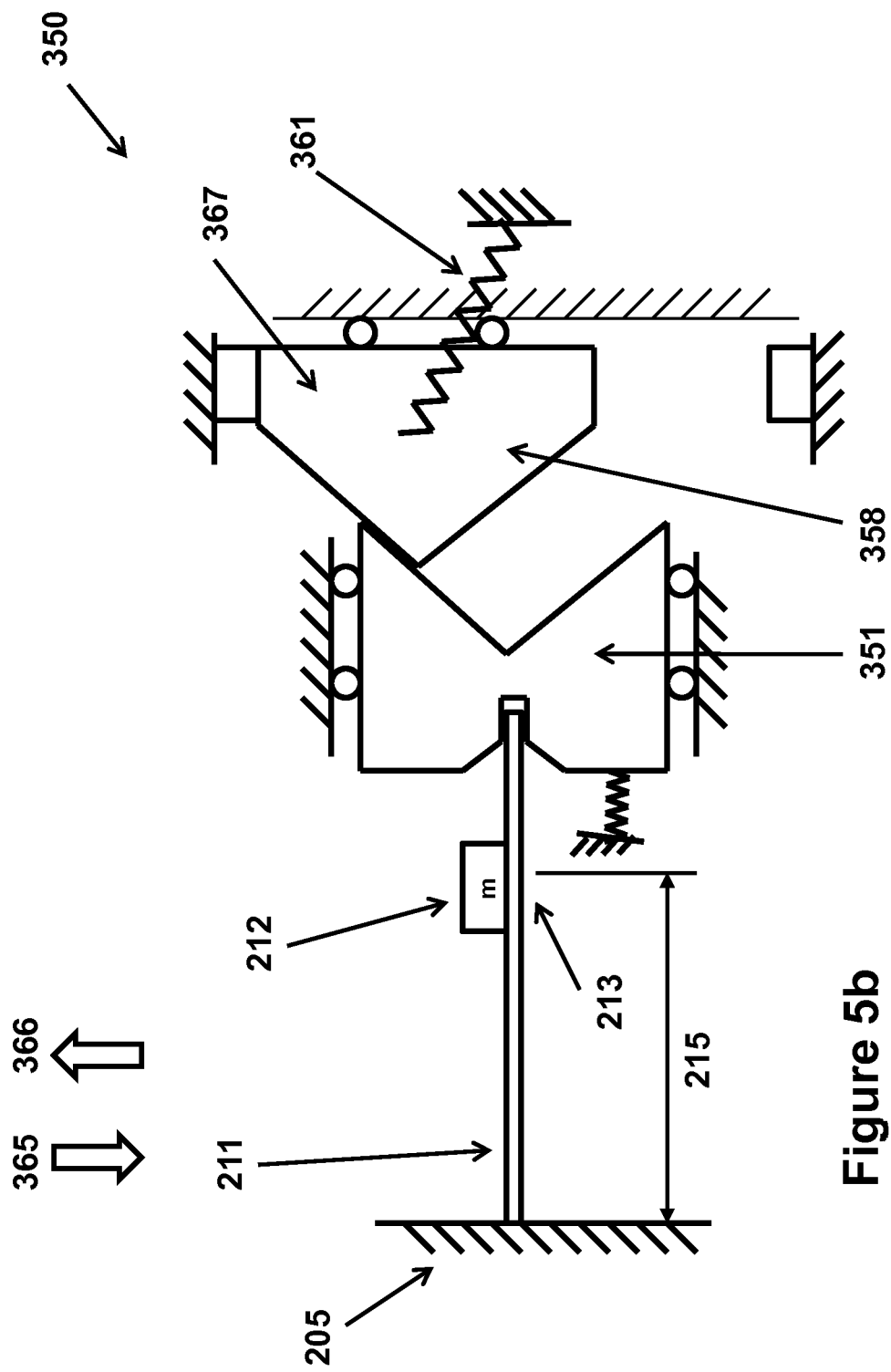
FIG. 5b illustrates the schematic of FIG. 5a in which the proof mass is locked in the null position.

If the sensor is subjected to a high acceleration level in the direction of the arrow 365, the dynamic force resulting from the action of the acceleration on the inertia of the element 358 will generate a force that if it is large enough to overcome the forces exerted by the spring element 361 and the vertical component of the contact force across the surface of contact (between the surfaces 356 and 362) generated by the spring element 364 (neglecting friction and other present resistive forces), it would begin to force the element 358 to translate up relative to the locking member 351. As a result, as the member 358 translates up towards its uppermost position indicated in FIG. 5b by the numeral 367, thereby the locking member 351 is pushed into position to engage the edge 214 of the plate 211 and essentially locking the plate 211 to the base structure of the sensor 205 as shown in FIG. 5b. On the other hand, if the sensor is subjected to a high acceleration level in the direction of the arrow 366, the dynamic force resulting from the action of the acceleration on the inertia of the element 358 will generate a force that if it is large enough to overcome the forces exerted by the spring element 361 and the vertical component of the contact force across the surface of contact (between the surfaces 357 and 363) generated by the spring element 364 (neglecting friction and other present resistive forces), it would begin to force the element 358 to translate down relative to the locking member 351. As a result, as the member 358 translates down towards its lowermost position (opposite to the position 367 of the element 351 shown in FIG. 5b), thereby similarly causing the locking member 351 to be pushed into position to engage the edge 214 of the plate 211 and essentially locking the plate 211 to the base structure of the sensor 205 as shown in FIG. 5b for the acceleration in the direction of the arrow 365.

Figure 6A:
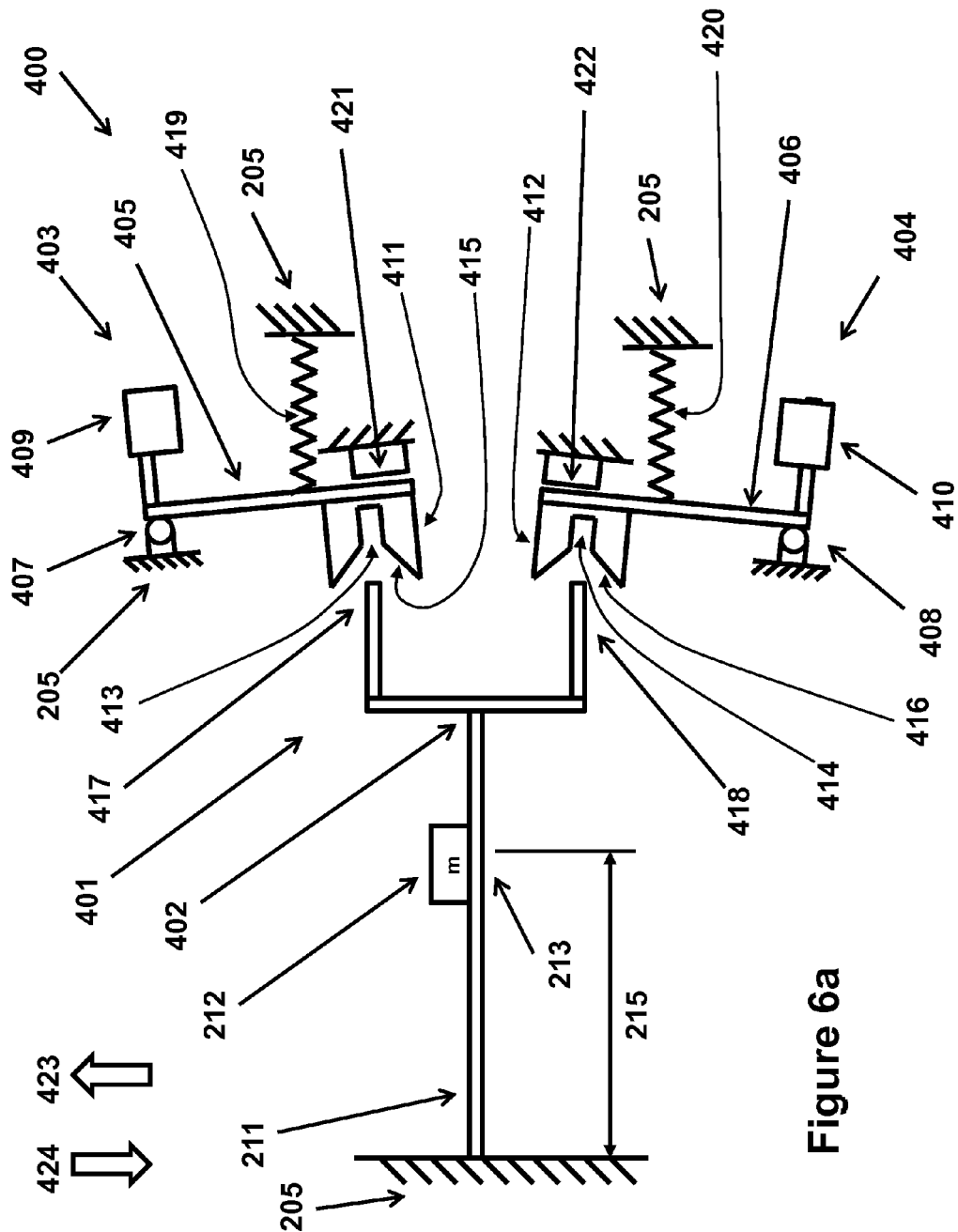
FIG. 6a illustrated the schematic of another accelerometer sensor embodiment having a passive means for locking the proof mass in a null position during periods of up or down accelerations above a predetermined threshold.

In the schematic of FIG. 6a, the sensor portion of the embodiment 400 is the same as that of the embodiment 200 shown in the schematic drawing of FIG. 2a, except that a relatively rigid and u-shaped element 401 is rigidly attached to the end 402 of the cantilever type of elastic element 211 as shown in FIG. 6a. In the schematic of FIG. 6a, the locking mechanism consists of two similar mechanisms 403 and 404, constructed with relatively rigid links 405 and 406, which are attached to the base structure of the sensor 205 by the hinge joints 407 and 408, respectively. The links 405 and 306 are provided with mass elements 409 and 410 on one end and the locking members 411 and 412 on the other end, respectively. The locking members 411 and 412 are each provided with u-shaped mouths 413 and 414 with tapered leading edges 415 and 416, respectively. The u-shaped mouths 413 and 414 are positioned such that with proper rotation of the links 405 and 306, they could capture the edges 417 and 418 of the u-shaped element 401, respectively, when the plate 211 it is to be essentially locked to the base structure 205 of the sensor 400. The links 405 and 406 are each provided with a spring element 419 and 420, which are attached to the base structure of the sensor 205 on one end and to the links 405 and 406, respectively, on the other end. The spring elements 419 and 420 are preferably preloaded in tension such that in the normal condition of the sensor 400, the links 405 and 406 are held against the stops 421 and 422, respectively.

Figure 6B:
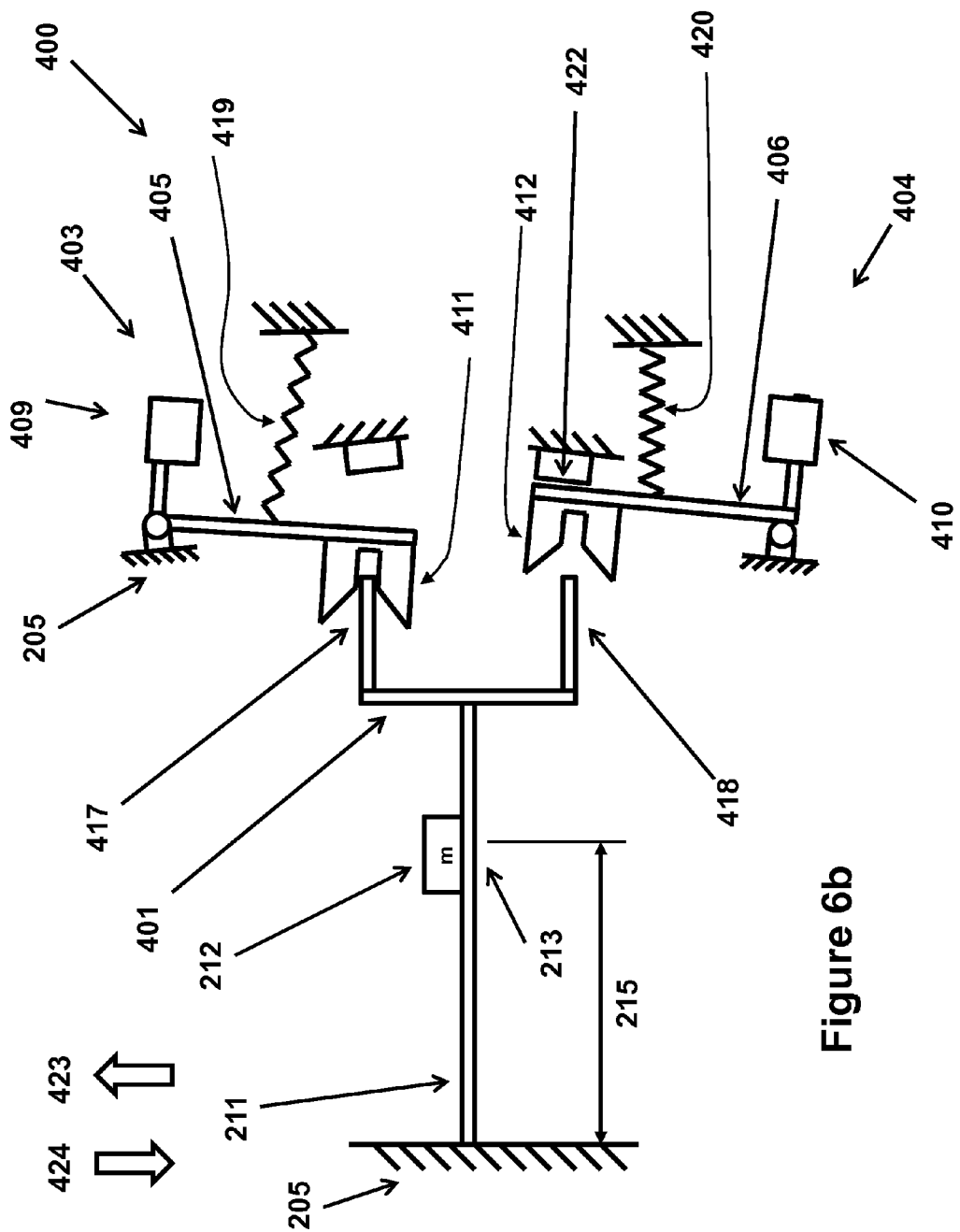
FIG. 6b illustrates the schematic of FIG. 6a in which the proof mass is locked in the null position.

Now if the sensor is subjected to a high acceleration level in the direction of the arrow 423, the dynamic force resulting from the action of the acceleration on the inertia of the mass element 409 of the locking mechanism component 403 will generate a torque that if it is large enough to overcome the force of the spring element 419, would begin to rotate the link 405 in the clockwise direction. As a result, as the link 405 is rotated in the clockwise direction, the locking member 411 is moved into position to engage the edge 417 of the u-shaped member 401, which is fixedly attached to the plate 211 and essentially locking the plate 211 to the base structure of the sensor 205 as shown in FIG. 6b. In the meantime, the acceleration in the direction of the arrow 423 acts on the mass element 410 of the locking mechanism component 404 and similarly generates a torque that would tend to rotate the link 406 in the counter-clockwise direction, thereby pressing the link 406 against the stop 422. Here, it is noted that it is assumed that the mass elements 409 and 410 represent the net imbalanced mass of the rotating elements of the locking mechanism components 403 and 404 acting certain distance to the right of the hinge joints 407 and 408, respectively.

On the other hand, if the sensor is subjected to a high acceleration level in the direction of the arrow 424, the dynamic force resulting from the action of the acceleration on the inertia of the mass element 410 of the locking mechanism component 404 and will generate a counter-clockwise torque that if it is large enough to overcome the force of the spring element 420, would begin to rotate the link 406 in the counter-clockwise direction. As a result, as the link 406 is rotated in the counter-clockwise direction, the locking member 412 is moved into position to engage the edge 418 of the u-shaped member 401, which is fixedly attached to the plate 211 and essentially locking the plate 211 to the base structure of the sensor 205 (not shown in FIG. 6b). In the meantime, the acceleration in the direction of the arrow 424 acts on the mass element 409 of the locking mechanism component 403 and similarly generates a torque that would tend to rotate the link 405 in the counter-clockwise direction, thereby pressing the link 405 against the stop 421 as shown in its configuration of FIG. 6a. Here, it is noted that it is assumed that the mass elements 409 and 410 represent the net imbalanced mass of the rotating elements of the locking mechanism components 403 and 404 acting certain distance to the right of the hinge joints 407 and 408, respectively.

Those skilled in the art will appreciate that a number of variations of the embodiments of FIGS. 2-6 may be constructed to perform the same tasks, i.e., to essentially lock the proof mass (inertia element) if the sensor is accelerated beyond a predetermined level (threshold) in two opposite directions, e.g., for the particular use of gun-fired munitions and mortars, during the firing setback as well as set-forward accelerations.

Figure 7A:
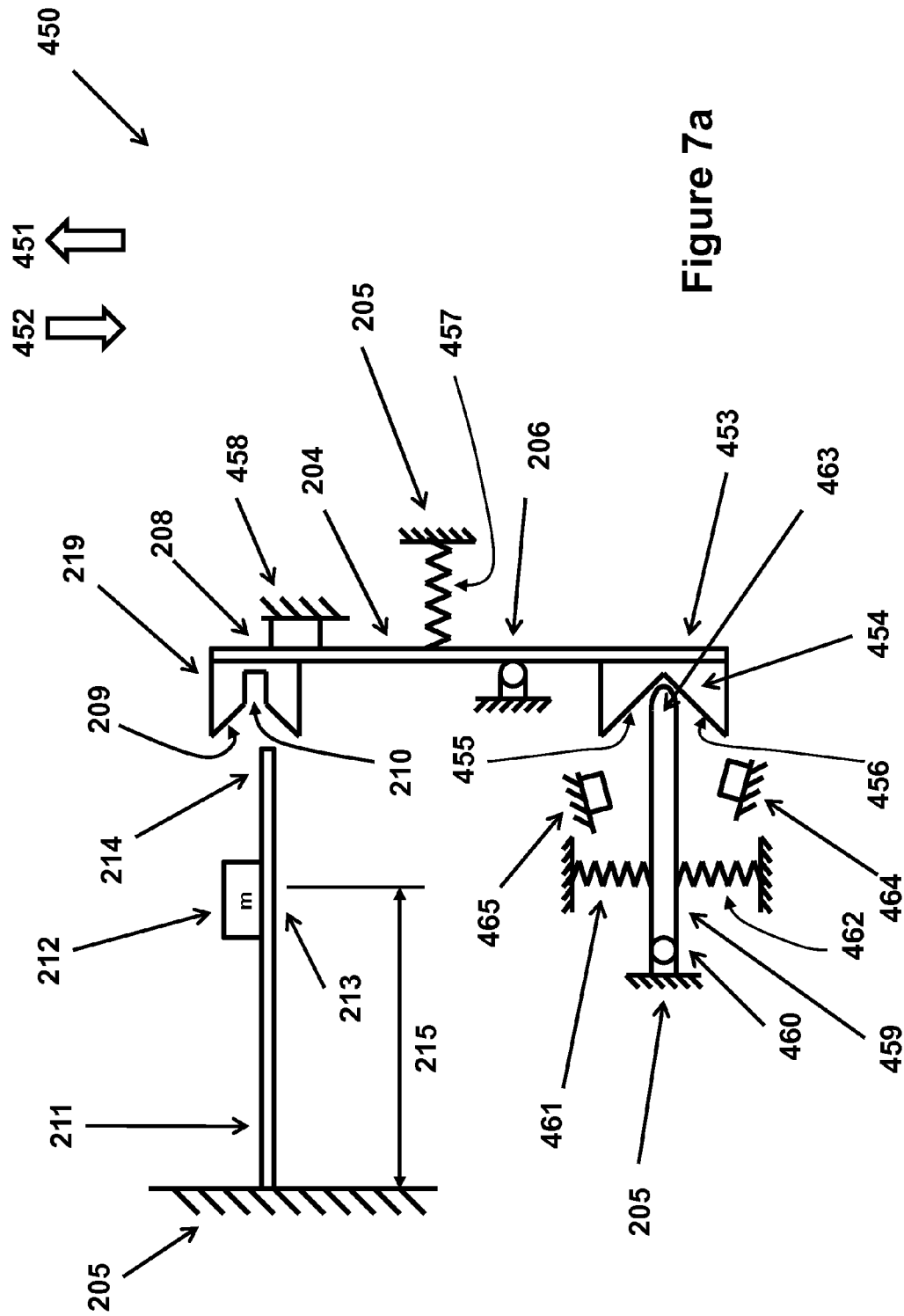
FIG. 7a illustrated the schematic of another accelerometer sensor embodiment having a passive means for locking the proof mass in a null position during periods of up or down accelerations above a predetermined threshold.

It is also appreciated by those skilled in the art that various features of the embodiments of FIGS. 2-6 may be combined to arrive at alternative designs that can perform the same aforementioned tasks. An example of an embodiment with such combined features is shown in FIG. 7a and indicated as embodiment 450. The accelerometer embodiment 450 shown is intended to measure acceleration in the directions 451 and 452. In the schematic of FIG. 7a, except for the locking mechanism portion described below, all other members of the embodiment 450 are identical to those of the embodiment 200 of FIG. 2a. In addition, identical locking member 219, attached to the relatively rigid link 204, which is in turn attached to the base structure of the sensor 205 by a hinge joint 206 as shown in the embodiment 200 of FIG. 2a are used in the present embodiment 450 of FIG. 7a. To the end 453 of the link 204, however, is fixedly attached the member 454, which has a v-shaped feature on its surface as shown in FIG. 7a, with inclined surfaces of the v-shaped feature indicated by numerals 455 and 456. A compressively preload spring element 457 is also provided that is attached to the base structure of the sensor 205 on one end and to the link 204 on the other. In normal conditions, the compressively preloaded spring element 457 forces the link 204 to rest against the stop 458, which is also attached to the base structure of the sensor 205. The locking mechanism is also provided with a relatively rigid link 459, which is attached to the base structure of the sensor 205 by a hinge joint 460. The link 459 is also provided with opposing spring elements 461 and 462, which are attached to the base structure of the sensor on one end and to the link 459 on the other end. The spring elements 461 and 462 are preloaded with equal amount of force such that in normal conditions, the link 459 is at rest in its middle position relative to the member 454 as shown in FIG. 7a. The link 459 is provided with the relatively round tip 463, which in the normal conditions positioned centrally with the v-shaped feature of the element 454.

The preloading forces in the spring elements 461 and 462 can be tensile, even though compressive forces may also be used. The spring rates of the spring elements 461 and 462 may, however, be selected to be different to allow the locking mechanism to lock the proof mass 212 at different acceleration threshold in the directions of the arrows 451 and 452. Alternatively, the spring elements may be torsional or of any other type. The hinge joint 460 can also be a living joint, and is preferably constructed with enough spring rate in torsion (i.e., provide enough elastic resistance in torsion) to serve the functionality of the spring elements 461 and 462 (in which case no preloading forces/torques or moments will in general be required). The link 459 is provided with stops 464 and 465 to limit the link clockwise and counter-clockwise rotation, respectively, so that the tip 463 would always stay within the range of the surfaces of contact 455 and 456 of the v-shaped feature of the element 454.

Figure 7B:
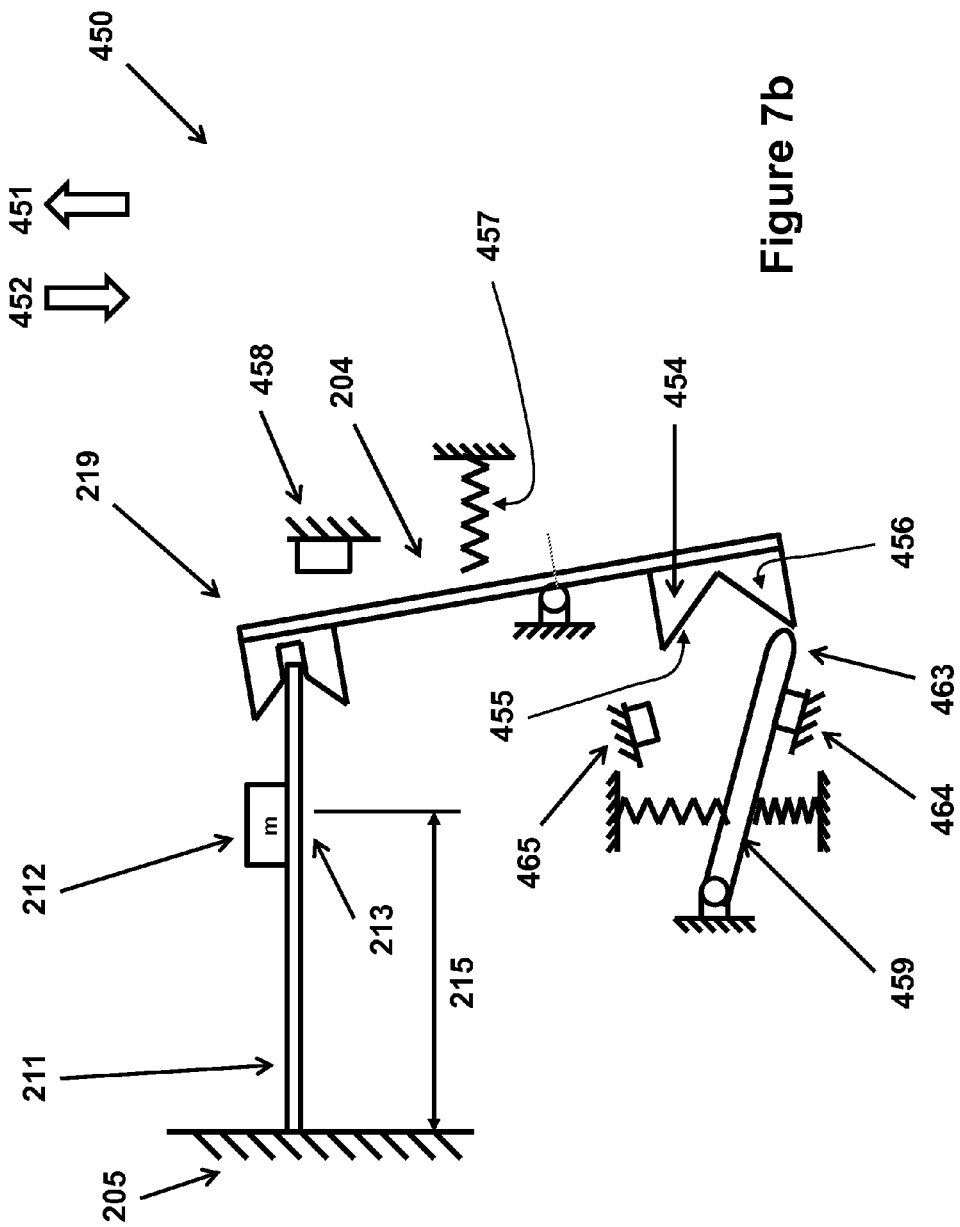
FIG. 7b illustrates the schematic of FIG. 7a in which the proof mass is locked in the null position.

If the sensor is subjected to a high acceleration level in the direction of the arrow 451, the dynamic force resulting from the action of the acceleration on the inertia of the link 459 will generate a torque that would tend to rotate the link 459 in the clockwise direction. If the acceleration level is high enough to overcome the resistance of the spring elements 461 and 462, then the link 459 is rotated clockwise up to the stop 464. As the link 459 is rotated in the clockwise direction, the tip 463 of the link 459 pushes against the surface 456 of the element 454, thereby causing the link 204 to rotate in the counter-clockwise direction, thereby moving the locking member 219 into position to engage the edge 214 of the plate 211 and essentially locking the plate 211 to the base structure of the sensor 205, as shown in FIG. 7b. If the sensor is subjected to a high acceleration level in the direction of the arrow 452, the dynamic force resulting from the action of the acceleration on the inertia of the link 459 will generate a torque that would tend to rotate the link 459 in the counter-clockwise direction. If the acceleration level is high enough to overcome the resistance of the spring elements 461 and 462, then the link 459 is rotated counter-clockwise up to the stop 465. As the link 459 is rotated in the counter-clockwise direction, the tip 463 of the link 459 pushes against the surface 455 of the element 454, thereby causing the link 204 to rotate in the counter-clockwise direction, thereby moving the locking member 219 into position to engage the edge 214 of the plate 211 and essentially locking the plate 211 to the base structure of the sensor 205 (not shown). As a result, the locking mechanism of this embodiment would lock the proof mass if the sensor is subjected to aforementioned high acceleration levels in either upward (451) or downward (452) direction, which for gun-fired munitions and mortars can correspond to firing setback and set-forward accelerations.

The locking mechanisms of the embodiments of FIGS. 2-7 were shown to provide for essentially locking the proof mass (inertia element) of inertia based sensors to the base structure of the sensor when the sensor is accelerated in either direction along (and close to) a certain line. For the particular case of gun-fired munitions and mortars and the like, the line of acceleration action is considered to be essentially parallel to the direction of firing setback and set-forward accelerations. In general, an inertia based sensor such as an accelerometer or gyro is required to be protected from high levels of accelerations that are essentially parallel (or have a substantial component) to the directions along which the inertia element of the sensor is intended to be subjected to the sensory acceleration signal to translate and/or rotate the inertia or generate a dynamic force and/or toque and/or moment. Such sensors are, in general, relatively unresponsive to sensor accelerations in directions that are substantially perpendicular to the required sensory response direction, and do not generally require protection for their proof mass (inertia elements) against shock induced accelerations in the latter directions. This is even true for gun-fired munitions, mortars and the like since the high firing accelerations are always applied axially to the projectile (in the direction of firing) and not in the lateral direction. However, if the projectile is accidentally dropped, the direction of impact induced acceleration is unpredictable and may be directed laterally. But since most inertia based sensors (accelerometers and gyros), particularly those that have high sensitivity, are designed with structures similar to those shown in FIGS. 1-7, i.e., with relatively low resistance to proof mass (inertia element) motion in one direction and significant resistance in other directions, therefore if the proof mass (inertia element) and other moving elements of the sensor are protected against high acceleration levels in the direction of the intended sensory measurements (as they are in the embodiments of FIGS. 2-7), then the sensor can be expected not to require similar proof mass (inertia element) protection against similarly high acceleration levels experienced from other directions.

On the other hand, if in certain applications, such as in certain multi-axis inertia based sensor, the sensor is designed with proof masses (inertia elements) that respond to accelerations from many (independent) directions (e.g., the aforementioned axial and lateral directions), then the locking mechanisms of the embodiments of FIGS. 2-7 may be modified to lock the proof mass (inertia element) when the sensor is subjected to both axial and/or lateral directions. The required modifications generally involve the addition/ repositioning of the mass (inertia) element that "actuates" the sensor proof mass (inertia element) locking mechanism, and/or by providing additional "actuation" mechanisms that respond to high laterally applied acceleration levels. Such implementation of the aforementioned modifications is illustrated by the following two example embodiments.

Figure 8:
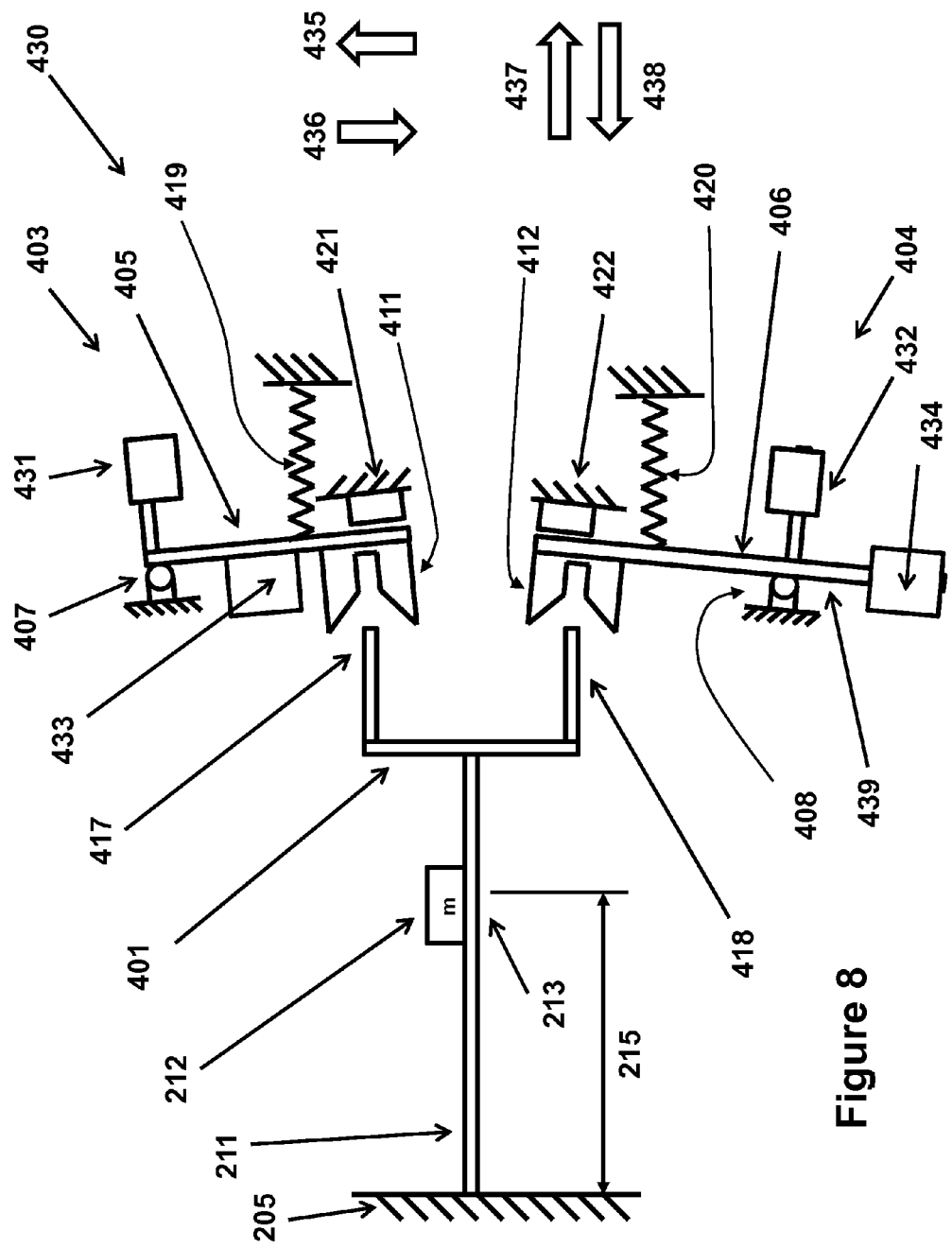
FIG. 8 illustrates the schematic of another accelerometer sensor embodiment having passive means for locking the proof mass in a null position during periods of up or down or lateral accelerations above predetermined threshold.

The schematic of the first modified embodiment 430 is shown in FIG. 8. The embodiment 430 is obtained by the following modification of the embodiment 400 illustrated in the schematic of FIG. 6a. In the embodiment 430, except for the following indicated modifications, all its elements are identical to those of the embodiment 400 and are identically enumerated. Firstly, the mass elements 409 and 410 of the embodiment 400 (enumerated as mass elements 431 and 432, respectively, in FIG. 8) are positioned on or close enough to the horizontal lines (in the plane of FIG. 8) passing through the hinge joints 407 and 408, respectively, so that when the sensor is subjected to accelerations in the directions of the arrows 437 or 438, the dynamic force acting on the inertia of the mass elements 431 and 432 does not generate a substantial torque about axes normal to the plane of FIG. 8, that would otherwise tend to rotate the locking elements 403 and 404. Secondly, a mass element 433 is attached to the link 405 between the hinge joint 407 and the element 411 as shown in FIG. 8. Thirdly, a mass element 434 is attached to the extended end 439 of the link 406 as shown in FIG. 8.

If the sensor is subjected to a high acceleration level in the direction of the arrow 437, the dynamic force resulting from the action of the acceleration on the inertia of the mass element 433 of the locking mechanism component 403 will generate a clockwise torque that if it is large enough to overcome the force of the spring element 419, would begin to rotate the link 405 in the clockwise direction. As a result, as the link 405 is rotated in the clockwise direction, the locking member 411 is moved into position to engage the edge 417 of the u-shaped member 401, which is fixedly attached to the plate 211 and essentially locking the plate 211 to the base structure of the sensor 205, similar to that shown in the schematic of FIG. 6b. On the other hand, the acceleration in the direction of the arrow 437 acts on the inertia of the mass element 434 to generate a clockwise torque that would tend to rotate the link 406 in the clockwise direction, pressing the link 406 against the stop 422, as shown in FIG. 8.

However, if the sensor is subjected to a high acceleration level in the direction of the arrow 438, the dynamic force resulting from the action of the acceleration on the inertia of the mass element 434 of the locking mechanism component 404 will generate a counter-clockwise torque that if it is large enough to overcome the force of the spring element 420, would begin to rotate the link 406 in the counter-clockwise direction. As a result, as the link 406 is rotated in the counter-clockwise direction and the locking member 412 is moved into position to engage the edge 418 of the u-shaped member 401—which is fixedly attached to the plate 211—and essentially locking the plate 211 to the base structure of the sensor 205 (not shown in FIG. 8). In the meantime, the acceleration in the direction of the arrow 437 acts on the mass element 433 of the locking mechanism component 403 and similarly generates a counter-clockwise torque that would tend to rotate the link 405 in the counter-clockwise direction, thereby pressing the link 405 against the stop 421 as shown in its configuration of FIG. 8.

Figure 9:
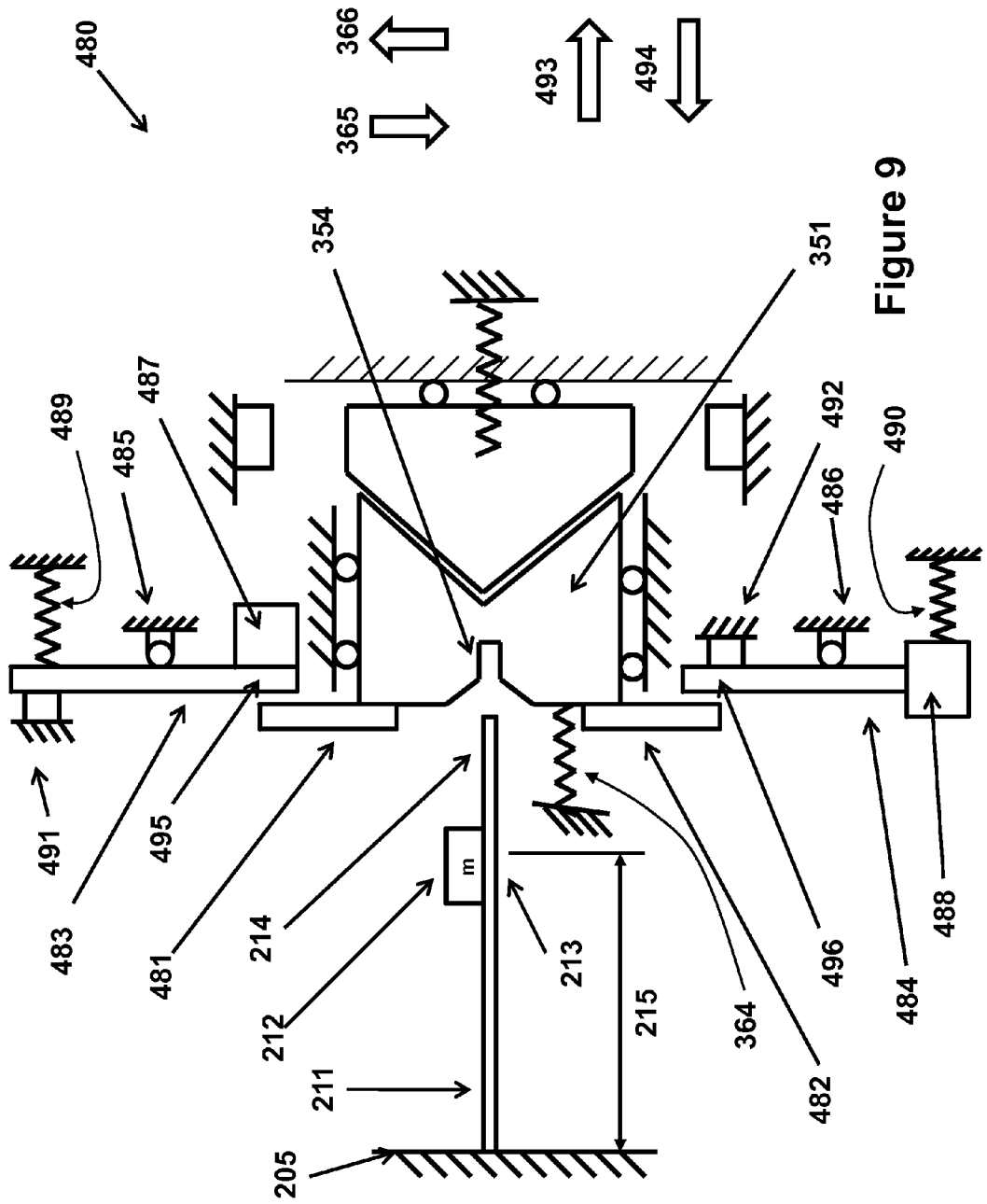
FIG. 9 illustrates the schematic of another accelerometer sensor embodiment having passive means for locking the proof mass in a null position during periods of up or down or lateral accelerations above predetermined threshold.

The schematic of the second modified embodiment 480 is shown in FIG. 9. The embodiment 480 is obtained by the following modification of the embodiment 350 illustrated in the schematic of FIG. 5a. In the embodiment 480, except for the following indicated modifications, all its elements are identical to those of the embodiment 350 and are identically enumerated. Firstly, extensions 481 and 482 are provided to the locking member 351. Secondly, links 483 and 484, which are attached to the base structure of the sensor 205 by the hinge joints 485 and 486, respectively, are provided as shown in FIG. 9. Mass elements 487 and 488 are attached to the links 483 and 484, respectively, as shown in FIG. 9. Spring elements 489 and 490, preloaded in compression, are provided and positioned as shown in FIG. 9 to hold the links 483 and 484 against the stops 491 and 492, respectively, when the sensor 480 is in its normal condition. It is noted that in the schematic of FIG. 9 and for the sake of clarity, the spring elements 489 and 490 are shown to be positioned such that they can force the links 483 and 484 against the stops 491 and 492. However, in practice, the spring elements 489 and 490 are can be positioned on the opposite sides of the links 483 and 484 to perform their tasks while preloaded in tension instead. In addition, the hinge joints 485 and 486 can be living joints and can be integrated spring elements 489 and 490.

If the sensor is subjected to a high acceleration level in the direction of the arrow 493, the dynamic force resulting from the action of the said acceleration on the inertia of the element 487 will generate a torque in the clockwise direction that if it is large enough to overcome the force exerted by the spring elements 489 and 364, would rotate the link 483 in the clockwise direction. As a result, as the link 483 turns in the clockwise direction, and its tip 495 would push against the surface of the extension 381, thereby pushing the locking member 351 into position to engage the edge 214 of the plate 211 and essentially locking the plate 211 to the base structure of the sensor 205 as shown in FIG. 5b. In the meantime, the acceleration acts on the inertia of the mass element 488, generating a torque in the clockwise direction that would force the link 484 against the stop 492.

However, if the sensor is subjected to a high acceleration level in the direction of the arrow 494, the dynamic force resulting from the action of the said acceleration on the inertia of the element 488 will generate a torque in the counter-clockwise direction that if it is large enough to overcome the force exerted by the spring elements 490 and 364, would rotate the link 484 in the counter-clockwise direction. As a result, as the link 484 turns in the counter-clockwise direction, and its tip 496 would push against the surface of the extension 382, thereby pushing the locking member 351 into position to engage the edge 214 of the plate 211 and essentially locking the plate 211 to the base structure of the sensor 205 as shown in FIG. 5b.

It is noted that in the embodiments of FIGS. 2-9, the proof mass (inertia) and other moving parts of the sensor is normally unlocked. In certain applications, however, it is desirable to keep the proof mass (inertia element) and generally other moving parts of the sensor locked to the base structure of the sensor until certain event is detected. For example, it might be desirable to keep the proof mass (inertia element) and other moving parts of a sensor that is designed to be highly sensitive to be protected from environmental noise such as vibration during transportation and other even minor shock loadings such as those experienced during the manufacturing and assembly processes. For the particular case of gun-fired munitions, mortars and the like, the event that would unlock the proof mass (inertial element) and other moving parts of the sensor will then preferably be the firing setback or set-forward acceleration, in particular, preferably the firing set-forward acceleration. Such inertia based sensors with normally locked proof mass (inertia element) and other moving parts may be obtained by modifying the locking mechanisms of the embodiments of FIGS. 2-9. The required modification generally involves the addition of appropriate inertia actuated elements that would normally lock the proof mass (inertia element) locking member in its locking position. Then when the sensor experiences the intended acceleration (linear or rotary) event, for example, once the sensor experiences the firing setback (or set-forward) acceleration, then the added locking member disengages from the proof mass locking member, thereby rendering the sensor operational. To illustrate the aforementioned modification, the embodiment of FIG. 5a is modified as described below to obtain a sensor in which the proof mass (inertia element) and other moving parts of the sensor would be essentially locked to the base structure of the sensor in normal conditions. The resulting sensor is then shown to be capable of being readily adapted for use in three different operational scenarios. In the first operational scenario, the proof mass (inertia element) and other moving parts of the sensor are essentially locked to the base structure of the sensor in normal conditions, and released as a result of a relatively high acceleration level in one direction (e.g., in the direction of firing setback acceleration for the case of sensors used in gun-fired munitions, mortars and the like). In the second operational scenario, the proof mass (inertia element) and other moving parts of the sensor are essentially locked to the base structure of the sensor in normal conditions, stay essentially locked during a relatively high acceleration level in one direction, and released as a result of a relatively high acceleration level in the second (e.g., opposite) direction (e.g., stay locked as a result of firing setback acceleration and release as a result of set-forward acceleration for the case of sensors used in gun-fired munitions, mortars and the like). In the third operational scenario, the proof mass (inertia element) and other moving parts of the sensor are unlocked from the base structure of the sensor in normal conditions, but become essentially locked to the base structure of the sensor as a result of a relatively high acceleration level in one direction, and released as a result of a relatively acceleration level in the second (e.g., opposite) direction (e.g., become locked as a result of firing setback acceleration and release as a result of set-forward acceleration for the case of sensors used in gun-fired munitions, mortars and the like). Such an embodiment is presented below.

Figure 10:
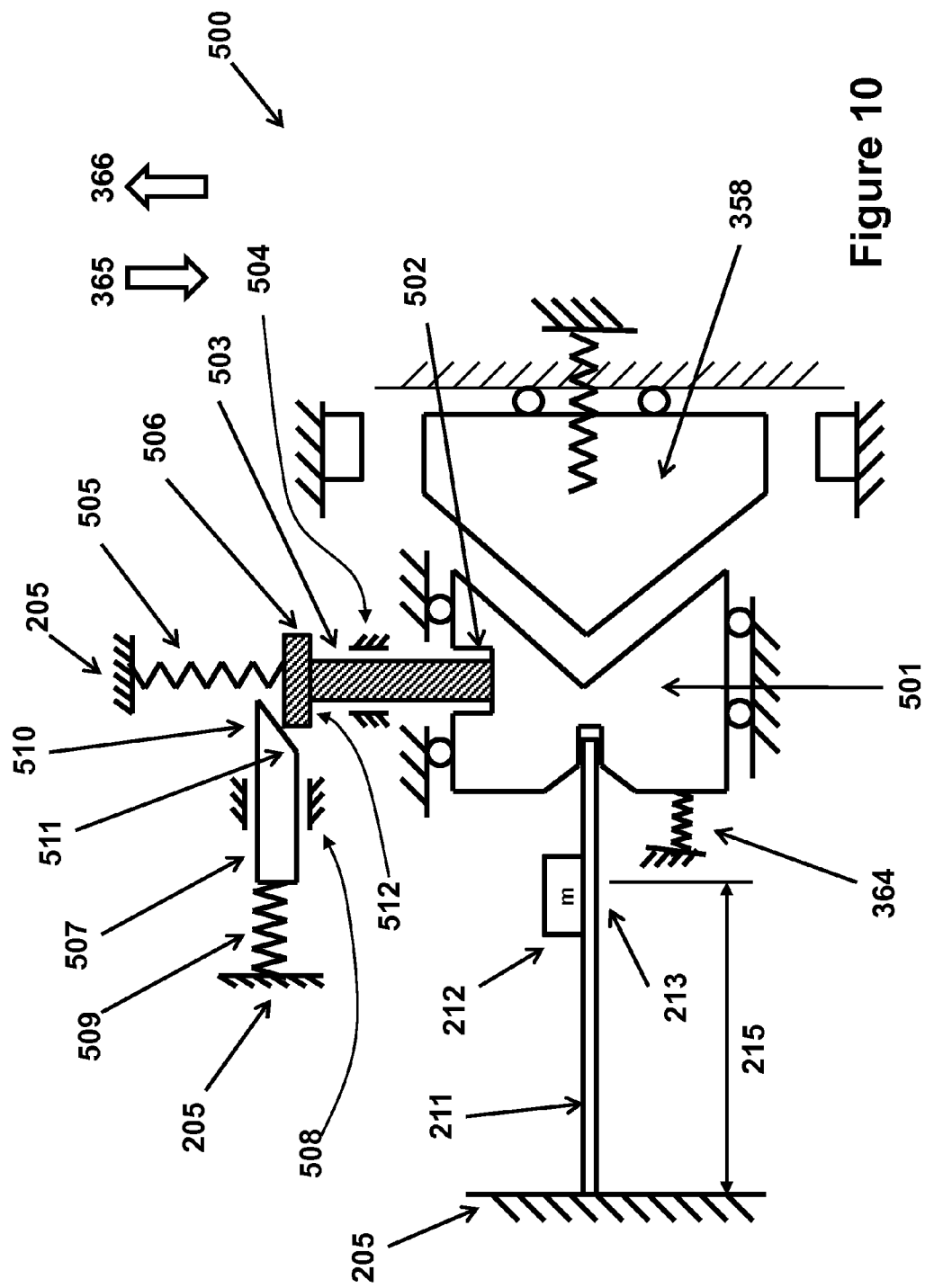
FIG. 10 illustrates the schematic of another accelerometer sensor embodiment having passive means for locking the proof mass in a null position during periods of up or down accelerations above predetermined threshold. The proof mass of the accelerometer is normally locked.

The basic design of an inertia based sensor for operation in the aforementioned three scenarios is described by the example of the embodiment 500 illustrated in the schematic drawing of FIG. 10. The embodiment 500 is obtained by the following modification of the embodiment 350 illustrated in the schematic of FIG. 5a. In the embodiment 500, except for the following indicated modifications, all its elements are identical to those of the embodiment 350 and are identically enumerated. Firstly, locking member 501 (indicated by numeral 351 in FIG. 5a) is provided with a recess 502. In the configuration shown in FIG. 10, the locking member 501 is in position to engage the edge 214 of the plate 211 and essentially locking the plate 211 to the base structure of the sensor 205 as described for the embodiment 350 of FIG. 5b. The locking member 501 is held in this position against the force of the spring element 364 by the locking element 503, which can slide up and down in the guide 504, which is fixed to the base structure of the sensor 205. The locking element 503 is kept engaged to the locking member 501 by the force exerted by the compressively preloaded spring element 505 on the top surface of the locking element 503. The sensor is also provided with a "latching" element 507, which can slide back and forth in the guide 508, which is fixed to the base structure of the sensor 205. The spring element 509 is provided, which is attached to the base structure of the sensor 205 on one end and to the base of the latching element 507 on the other end as shown in FIG. 10. The element 507 is held the shown position, i.e., with the tip 510 over the extended end 506 of the locking element 503, preferably with the sloped surface 511 in contact with the said tip 510 as shown in FIG. 10.

In the normal configuration shown in FIG. 10, the spring elements 505 and 509 are preferably preloaded in compression such that if the sensor 500 is subjected to acceleration levels of up to a certain threshold in the direction of the arrow 365, the dynamic force generated by the action of the acceleration on the inertia of the locking element 503 is not enough to overcome the forces exerted by the spring elements 505 and 509. However, if the sensor 500 is subjected to high enough acceleration levels in the direction of the arrow 365, then the dynamic force generated by the action of said acceleration on the inertia of the locking element 503 would overcome the forces exerted by the spring elements 505 and 509, thereby allowing the locking element 503 to translate up and disengage recess 502 of the locking member 501. During this process, the locking element 503 would also force the latching element 507 away from its path of translation by applying a force to the inclined surface 511 of the latching element 507. However, once the bottom surface 512 of the extended end portion 506 of the locking element 503 has passed the tip 510 of the latching element 507, the tip 510 of the latching element 507 is pushed under the bottom surface 512 of the extended end portion 506 of the locking element 503. As a result, when the aforementioned high acceleration level has ceased, the locking element 503 can no longer slide back down to engage the recess 502 of the locking member 501. The sensor 500 is thereby free to operate as was previously described for the embodiment 350 of FIG. 5a.

The inertia sensor embodiment 500 of FIG. 10 is readily shown to be capable of operating in the aforementioned first and second operational scenarios and with a simple modification, in the aforementioned third operational scenario as follows.

To be employed for operation in the aforementioned first operational scenario, the sensor 500 is oriented such that the firing setback acceleration is in the direction of the arrow 365, FIG. 10. As a result, the proof mass 212 and other moving parts of the sensor 500 in normal conditions are essentially locked to the base structure of the sensor. The proof mass 212 and other moving parts of the sensor 500 are, however, released as a result of the firing setback acceleration as described above and the sensor 500 becomes operational and operates as was previously described for the embodiment 350 of FIG. 5a.

To be employed for operation in the aforementioned second operational scenario, the sensor 500 is oriented such that the firing setback acceleration is in the direction of the arrow 366, FIG. 10. As a result, the proof mass 212 and other moving parts of the sensor 500 in normal conditions are essentially locked to the base structure of the sensor and stay locked during the period of firing setback acceleration since the acceleration causes the locking element 503 to be pressed down against the locking member 501 and thereby stay engaged in the recess 502. The proof mass 212 and other moving parts of the sensor 500 are, however, released as a result of the firing set-forward acceleration, which would be in the direction of the arrow 365, thereby rendering the sensor 500 operable to function as was previously described for the embodiment 350 of FIG. 5a.

To be employed for operation in the aforementioned third operational scenario, the sensor 500 is oriented such that the firing setback acceleration is directed in the direction of the arrow 366, FIG. 10. The proof mass 212 and other moving parts of the sensor 500 are not locked to the base structure of the sensor 205 by the locking member 501. The locking element 503 assembly is modified as described later and shown in the schematic of FIGS. 11a and 11b so that during the setback acceleration period, the locking element can pass the latching element tip 510 and engage the recess 502 of the locking member 501, noting that as a result of the applied setback acceleration, the element 358 would have pushed the locking member 501 to engage the edge 214 of the plate 211 and essentially locking the plate 211 to the base structure of the sensor 205 as described for the embodiment 350 of FIG. 5b, thereby lining up the recess 502 under the locking element 503. Then during the set-forward acceleration period, the sensor 500 is accelerated in the direction of the arrow 365, thereby forcing the locking element 503 to translate away from the locking member 501 and releasing it to operate freely as was described for the embodiment 350 of FIG. 5a.

The schematic of the modified assembly of the locking element 503 and the latching element 507 is shown in the schematics of FIGS. 11a and 11b. In this modification, the extended top portion 506 of the locking element 503 is attached to the locking element body 503 by a sliding joint to allow it to slide from its centered position shown in FIGS. 10 and 11b to its right hand most position indicated by the numeral 520 shown in FIG. 11a. In its latter position, the element 506 clears the tip 510 of the latching element 507. A relatively rigid member 521 is fixedly attached to the side of the extended top portion 506 as shown in FIG. 11a. In the configuration shown in FIG. 11a (which corresponds to the configuration in which the locking element is disengaged from the locking member 501, FIG. 10), the member 521 is held against the member 522, which is fixed to the base structure of the sensor 205. The spring element 523 is also provided, which is attached to the locking element body on one end and to the member 521 on the other and which is preloaded in tension is used to provide a force that would tend to bring the element 506 back to its centrally positioned location shown in FIGS. 10 and 11b, thereby keeping the elements 521 and 522 in constant contact. Then as a result of the aforementioned firing acceleration in the direction of the arrow 366, FIG. 10, the assembly of the extended top portion 506 and the locking element 503 is pushed downward, allowing the element 506 to pass the latching element 507, following which the element 521 passes the element 522, thereby allowing the spring element 523 to pull the element 506 to its central position as shown in FIG. 11b.

Figure 12:
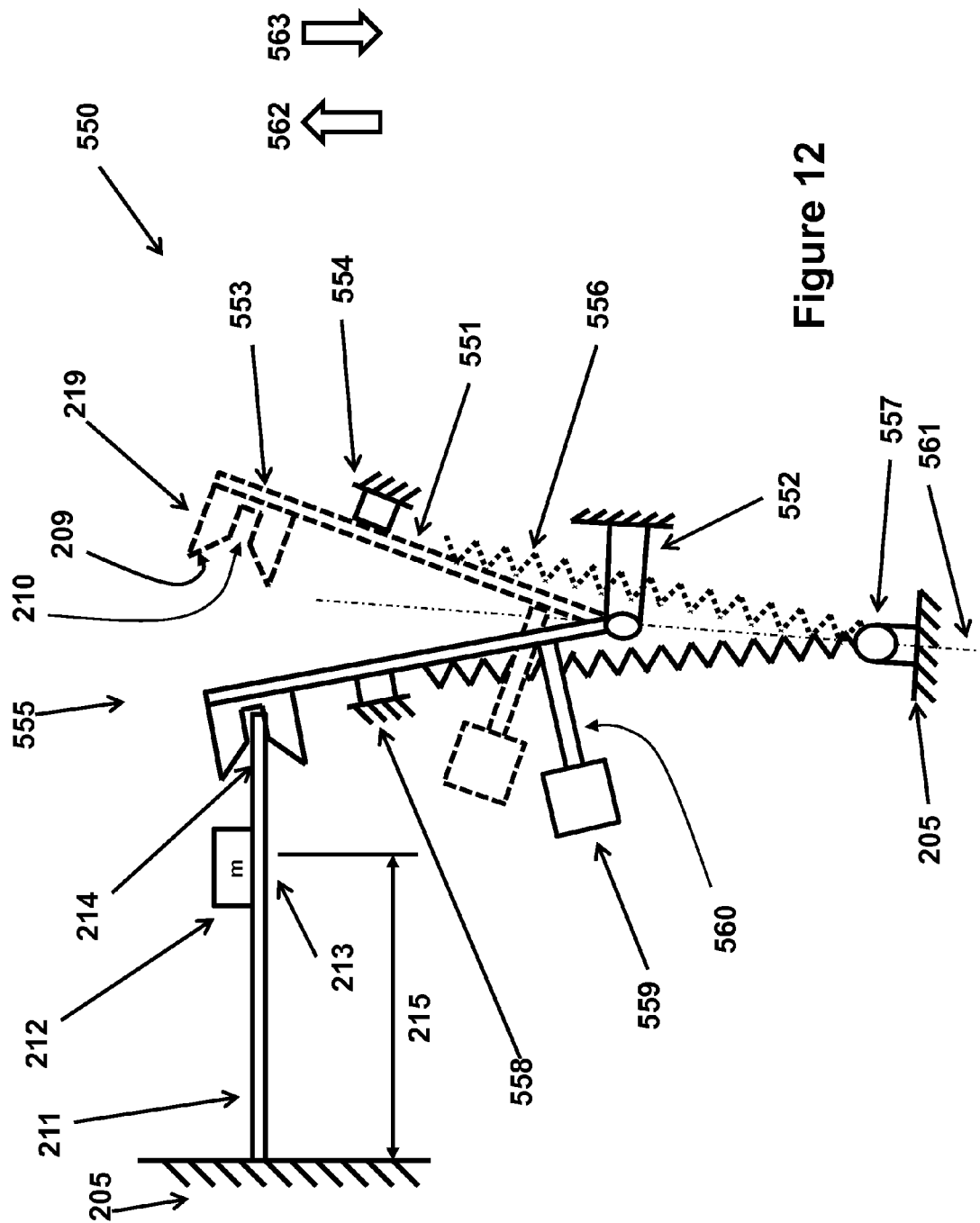
FIG. 12 illustrates the schematic of another accelerometer sensor embodiment having toggle mechanism type of passive means for locking the proof mass in a null position during periods of up or down accelerations above predetermined threshold.

An alternative embodiment for inertia based sensors to be employed for operation in the aforementioned third operational scenario may be obtained by the use of a toggle type of mechanism. Such a mechanism may be constructed, for example, by the following modification of the embodiment 200 of FIG. 2a, illustrated in the schematic of FIG. 12 and indicated by the numeral 550. The embodiment 550 is obtained by the following modification of the embodiment 200 illustrated in the schematic of FIG. 2a. In the embodiment 550, except for the following indicated modifications, all its elements are identical to those of the embodiment 200 and are identically enumerated. In the embodiment 550, the link 204 of the embodiment 200 of FIG. 2a is replaced by the link 551, which is attached to the base structure of the sensor 205 by the hinge joint 552. The element 219 with the u-shaped mouth 210 and tapered leading edge 209 which is identical to that of embodiment 200 of FIG. 2a is attached to the end 553 of the link 551 to similarly capture the edge 214 of the plate 211 when it is to be essentially locked to the base structure 205 of the sensor 550 (as shown in the link 551 assembly with solid lines and indicated by numeral 555). In the configuration 555, the link 551 rests against the stop 558. In this configuration, the link 551 assembly is held against the stop 558 by the spring element 556 (shown with solid lines), which is preloaded in tension. The spring element 556 is attached to the base structure 205 of the sensor at the hinge joint 557 on one end and to link 551 on the other end. In its proof mass disengaged configuration, the link 551 assembly is shown in FIG. 12 with dashed lines. In this configuration, the link 551 rests against the stop 554. In this configuration, the link 551 assembly is also held against the stop 554 by the spring element 556 (shown with dotted lines), which is preloaded in tension. A mass element 559 is also attached to the link 551 by the extension element 560 as shown in FIG. 12. The extension element 560 is long enough so that the mass element 559 is positioned to the left of the hinge joint 552 in both aforementioned configurations of the link 551 assembly shown in solid and dashed lines in FIG. 12.

It is noted that the link 551 and the tension preloaded spring element 556 assembly together with the stops 554 and 558 form a toggle mechanism in which the link 551 is in its stable configuration at two different angular positions, in this case, the two angular positions illustrated by solid and dashed lines, as resting and being held against the stops 558 and 554. It is appreciated by those skilled in the art that the link 551 assembly together with the stops 554 and 558 form a toggle mechanism since the spring element 556 is positioned on either side of the line connecting the hinge joints 552 and 557 (shown by the centerline 561), thereby applying a clockwise torque to the link 551 when the link is in its right hand configuration (shown with dashed lines), thereby holding it against the stop 554. However, when the link 551 is in its left hand configuration (shown with solid lines), the spring element 556 applies a counter-clockwise torque to the link 551, thereby holding it against the stop 558.

The inertia sensor 550 can now be employed for operation in the aforementioned third operational scenario. Consider the situation in which the link 551 assembly is in its disengaged configuration (shown in dashed lines in FIG. 12). Now if the sensor 550 is oriented such that the firing setback acceleration is directed in the direction of the arrow 562, the acceleration will act on the inertia of the mass element 559, and apply a counter-clockwise torque to the link 551 assembly, and rotate it in the counter-clockwise direction to its configuration 555, thereby allowing the u-shaped locking member 219 to similarly capture the edge 214 of the plate 211 when it is to be essentially locked to the base structure 205 of the sensor 550. Then when the sensor 550 is subjected to set-forward acceleration, i.e., when the sensor is accelerated in the direction of the arrow 563, the acceleration will act on the inertia of the mass element 559, and apply a clockwise torque to the link 551 assembly, and rotate it in the clockwise direction to its configuration shown with dotted lines, thereby disengaging the u-shaped locking member 219 from the edge 214 of the plate 211, thereby unlocking the proof mass 212 and the other moving parts of the sensor from the base structure 205 of the sensor 550.

It is appreciated by those skilled in the art that by the toggle mechanism shown in the embodiment of FIG. 12 may be designed such that the acceleration thresholds at which the link 551 assembly is rotated from one of its configurations to the other be different. They can, for example be achieved by proper positioning of the mass element 559 or by proper positioning of the stops 554 and 558 or proper design of the spring element 556 and its positioning.

It is also appreciated by those skilled in the art that a number of the disclosed embodiments can also protect the proof mass (inertia element) and other moving parts of inertia sensors when the sensor is subjected to certain rotational acceleration levels that are beyond predetermined threshold. For example, if the sensor embodiments 200 of FIG. 2a and 250 of FIG. 3a are rotationally accelerated in the clockwise or counter-clockwise direction (along an axis perpendicular to the paper), the applied rotational acceleration acts on the inertia of the mass element 207 (assuming all other moving elements, including the link 204 assembly has a balanced inertia about the axis of rotation of the hinge joint 206), and pushes the mass element 207 either up or down, and cause the link 204 to rotate counter-clockwise and engage the locking member 219 with the tip 214 of the plate 211 to essentially lock the proof mass 212 to the base structure 205 of the sensor. The embodiment 300 of FIG. 4a, embodiment 400 of FIG. 6a, embodiment 450 of FIG. 7a, embodiment 430 of FIG. 8, and embodiment 480 of FIG. 9 would similarly react to high clockwise and counter-clockwise accelerations of the respective sensors and essentially lock the proof mass (inertia element) and other moving parts of the sensor to its base structure.

It is noted that in the embodiments 300 and 350 of FIGS. 4a and 5a, the sliding joints for the locking members 301 and 351 and the member 358 of the embodiment 350 of FIG. 5a are shown to be formed using rolling elements. In practice, however, particularly when using MEMS technology to design such inertia based sensors, the sliding joints can be produced as living joints. The tip of the rotating links (311, 312, 454 etc.) may be shaped and positioned relative to the surface of the v-shaped feature (the surface of which may be formed) such that the resulting motion during high acceleration levels is smooth and also that possibly, for small accelerations, no movement of the v-shaped element results (possibly corresponding to the acceleration thresholds).

Figure 13:
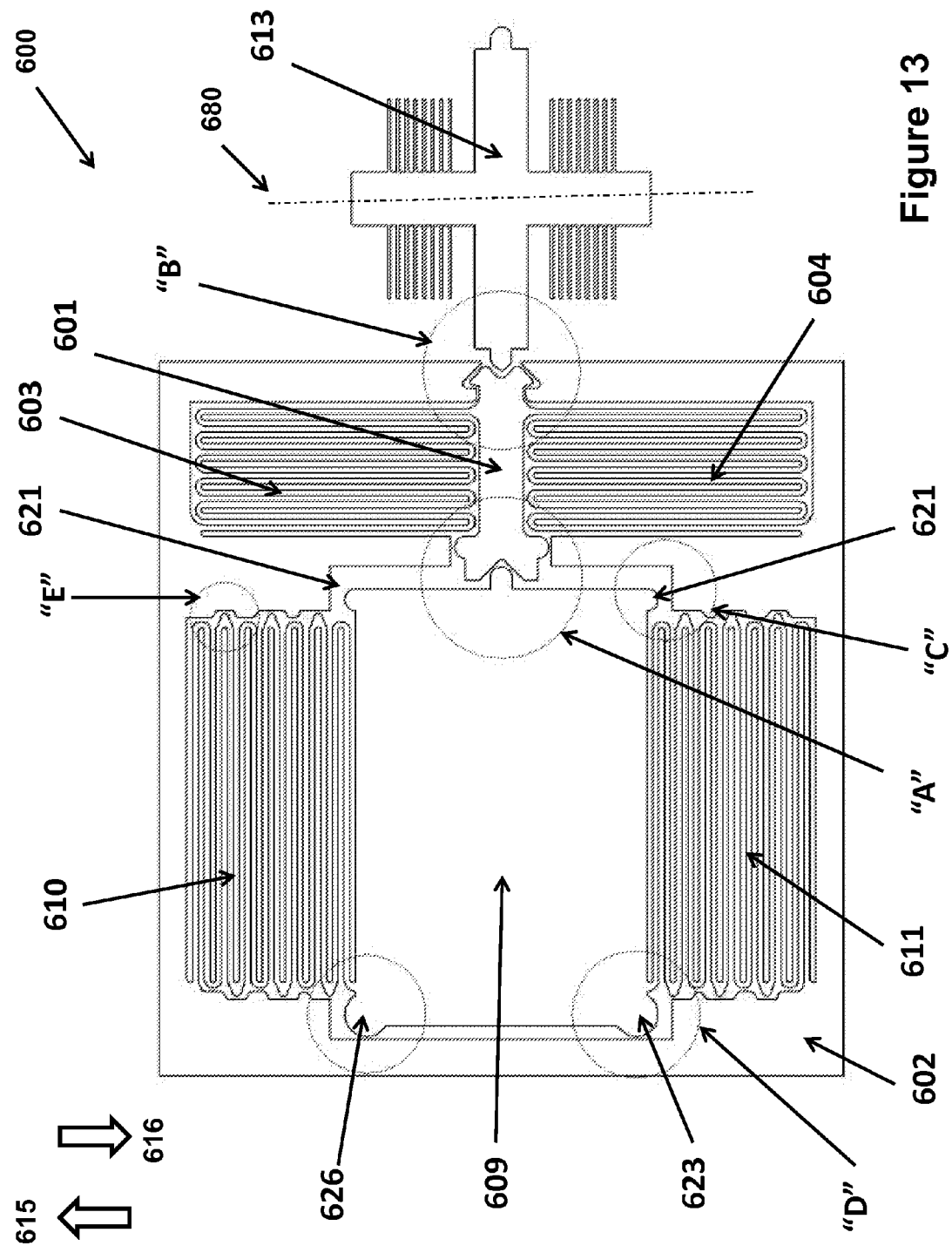
FIG. 13 illustrates the schematic of an accelerometer sensor embodiment with a passive mechanism for locking the proof mass in a null position during periods of up or down accelerations above predetermined threshold as designed for fabrication using MEMS technology.

An embodiment of an accelerometer sensor 600 designed for fabrication using MEMS technology or one of its different variations is shown in the schematic of FIG. 13. The accelerometer sensor 600 is essentially symmetric about the indicated line of symmetry 680 and in the schematic of FIG. 13 mostly one half (left hand) portion of the entire accelerometer sensor 600 is shown to make it possible to more clearly show the details of the device. The accelerometer sensor 600 is designed to operate mostly similar to the embodiment 350 of FIGS. 5a and 5b and consists of similar components. The accelerometer sensor 600, however, provides additional features, which make it particularly suitable for fabrication using MEMS technology. It also provides certain features that allow it to operate properly and for its components to be protected when the device is subjected to very high acceleration levels. In the accelerometer sensor 600, the locking mechanism consists of the locking member 601 (corresponding to the member 351 in the embodiment 350 of FIG. 5a), which is attached to the base structure 602 of the accelerometer sensor 600 by symmetrically positioned spring members 603 and 604. The locking mechanism of the accelerometer sensor 600 also consists of the "locking mass" 609 (corresponding to the rigid member 358 in the embodiment 350 of FIG. 5a), which is attached to the base structure 602 of the device 600 by symmetrically positioned spring members 610 and 611. The pair of springs 603 and 604, which each can consist of at least two parallel positioned springs as will be shown in embodiments described later, are provided to allow the locking member 601 to translate laterally (i.e., horizontally as seen in the schematic of FIG. 13), acting as a combination of a sliding living joint and a spring element similar to the locking member 351 and the spring element 364 in the embodiment 350 of FIG. 5a. The regions around the two ends of the locking member 601 are shown in the blow-up views "A" and "B", shown in FIGS. 14a and 14b, respectively. As can be seen in the blow up view "A" in FIG. 14a, at this end, the locking member 601 is provided with a v-shaped geometry with surfaces indicated by numerals 605 and 606. A similar v-shaped geometry with surfaces indicated by the numerals 607 and 608 are provided on the other end of the locking member 601 as shown in the blow up view "B" in FIG. 14b.

The pair of springs 610 and 611, are provided to allow the locking mass 609 to translate and rotate with respect to the base structure 602 of the accelerometer sensor 600, thereby acting as a combination of living joints and spring element similar to the rigid member 358 and the spring element 361 in the embodiment 350 of FIG. 5a, except the locking mass 609 is allowed to translate in any direction in the plane of the accelerometer sensor 600 as well as undergo rotation in the same plane for the reasons described later. The locking mass 609 is provided with a rounded tip element 612 as shown in the blow up view of FIG. 14a, which is intended to engage the v-shaped geometry surfaces 605 and 606 of the locking member 601 as shown in the blow up view of FIG. 14a and in FIG. 13.

Figure 14B:
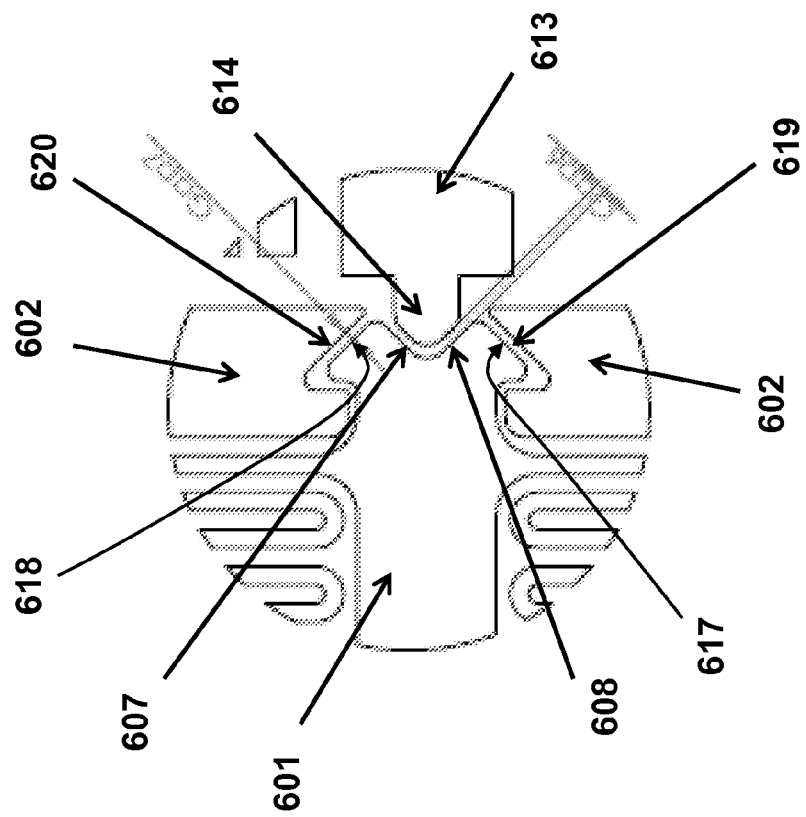
FIG. 14b illustrates a blow up view of another region of the embodiment of FIG. 13 illustrating geometrical details of the region.

A proof mass 613 of the accelerometer sensor 600 is also provided with a rounded tip element 614 as shown in the blow up view of FIG. 14b, which is intended to engage the v-shaped geometry surfaces 607 and 608 of the locking member 601 as shown in the blow up view of FIG. 14b and in FIG. 13.

It is noted that in the schematic of FIG. 13 the details of the proof mass design and its corresponding (usually capacitive) sensory elements are not shown in detail due to the fact that as is discussed later in this disclosure, any accelerometer or gyro or the like sensory design may use the proof mass (inertial element) locking mechanism of the accelerometer sensor 600 or the later disclosed embodiments.

If the accelerometer sensor 600 is subjected to an acceleration in the direction of the arrow 615, the dynamic force resulting from the action of the acceleration on the inertia of the locking mass 609 will generate a force that will begin to cause the locking mass 609 to move essentially downward, while subjecting the spring element 611 to compression and the spring element 610 to tension. The mass of the locking mass 609 and the spring rates of the springs 610 and 611 are selected such that while the acceleration in the direction of the arrow 615 is below a certain selected level, the rounded tip element 612 does not come into contact with the surface 606 of the v-shaped geometry of the locking member 601 as shown in the blow up view of FIG. 14*a*. And as the acceleration in the direction of the arrow 615 is increased, the rounded tip of the element 612 will come in contact with the surface 606 and begin to push against it, thereby causing the locking member 601 to be displaced towards the right. The mass of the locking mass 609 relative to the mass of the proof mass 613 and the spring rates of the springs 610, 611, 603 and 604 are also selected such that when the acceleration in the direction of the arrow 615 reaches a prescribed threshold, the locking member 601 is displaced enough to the right to force the v-shaped geometry of the locking member with surfaces 607 and 608 to come into contact with the rounded tip element 614 of the proof mass 613, preventing it from being displaced up or down, essentially locking the proof mass 613 in its null (near zero acceleration level) position to the accelerometer base structure 602. The right hand end of the locking member 601 is also provided with inclined surfaces 617 and 618 such that as the level of acceleration in the direction of the arrow 615 is increased, at or slightly after the locking member has locked the proof mass 613 to the accelerometer base structure 602 as described, the inclined surfaces 617 and 618 would engage mating surfaces 619 and 620, respectively, that are provided on the accelerometer base structure 602, thereby preventing the end of the locking member 601 from moving up or down relative to the accelerometer base structure 602.

On the other hand, if the accelerometer of accelerometer sensor 600 is subjected to an acceleration in the direction of the arrow 616, the dynamic force resulting from the action of the acceleration on the inertia of the locking mass 609 will generate a force that will begin to cause the locking mass 609 to move essentially upward, while subjecting the spring element 610 to compression and the spring element 611 to tension. The aforementioned selection of the mass of the locking member 601 and the spring rates of the springs 610 and 611 ensures that while the acceleration in the direction of the arrow 616 is below the aforementioned selected level, the rounded tip element 612 does not come into contact with the surface 605 of the v-shaped geometry of the locking member 601 as shown in the blow up view of FIG. 14*a*. And as the acceleration in the direction of the arrow 616 is increased, the rounded tip of the element 612 will come in contact with the surface 605 and begin to push against it, thereby causing the locking member 601 to be displaced towards the right. Then when the acceleration in the direction of the arrow 616 reaches the aforementioned prescribed threshold, the locking member is displaced enough to the right to force the v-shaped geometry of the locking member with surfaces 607 and 608 to come into contact with the rounded tip element 614 of the proof mass 613, and preventing it from displacing up or down, thereby similarly essentially locking the proof mass 613 in its null (near zero acceleration level) position to the accelerometer base structure 602. As the level of acceleration in the direction of the arrow 616 is increased, the inclined surfaces 617 and 618 would similarly engage the mating surfaces 619 and 620, respectively, thereby preventing the end of the locking member 601 from moving up or down relative to the accelerometer base structure 602.

Hereinafter, when the acceleration acting on the accelerometer sensor 600 in the direction of 615 or 616 is above a threshold that would cause the locking member 601 to begin to lock the proof mass 613 to the accelerometer base structure 602, the acceleration level is referred to as a "high acceleration" level.

Figure 14A:
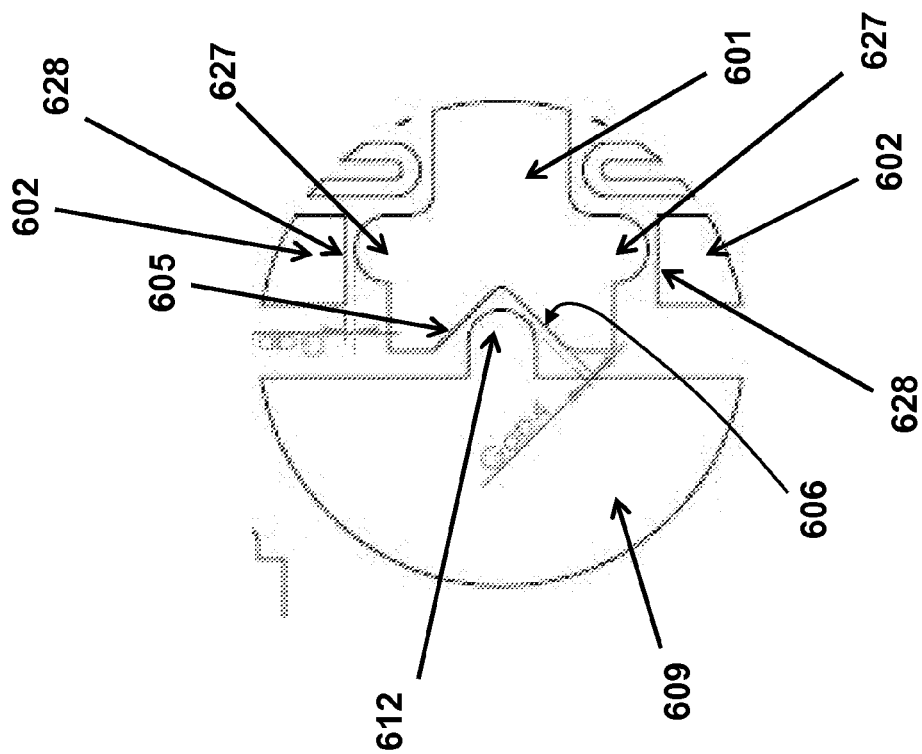
FIG. 14a illustrates a blow up view of one region of the embodiment of FIG. 13 illustrating geometrical details of the region.
Figure 14D:
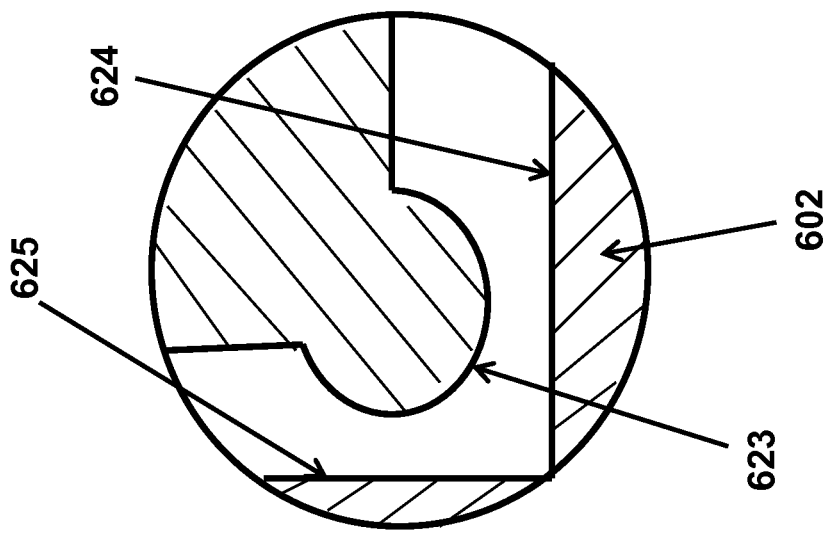
FIG. 14d illustrates a blow up view of another region of the embodiment of FIG. 13 illustrating geometrical details of the region.
Figure 14C:
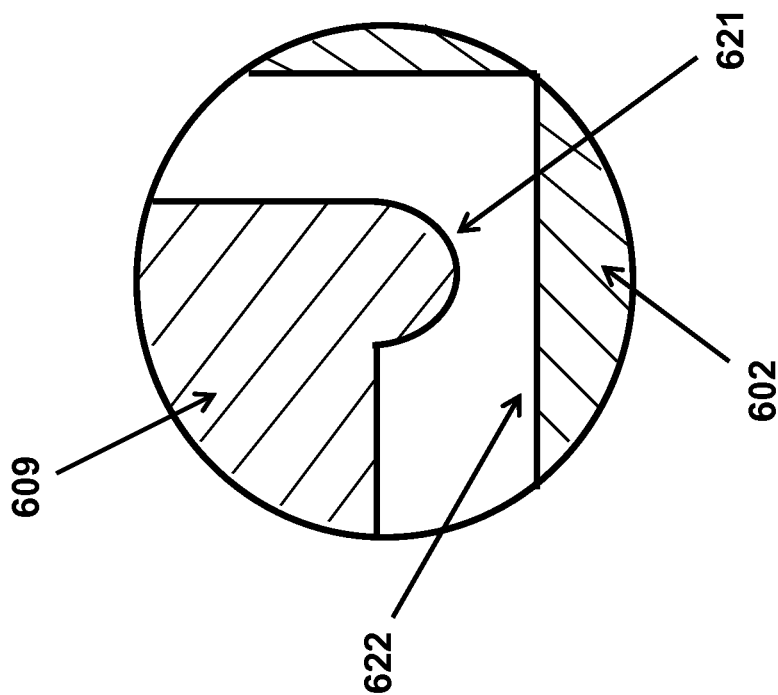
FIG. 14c illustrates a blow up view of another region of the embodiment of FIG. 13 illustrating geometrical details of the region.

As can be seen in the schematic of FIG. 13, the locking mass 609 is provided with preferably rounded corner geometries, such as shown in the blow up view "C" of FIG. 14*c* for the indicated corner. In the corner shown in the blow up view "C" of FIG. 14*c*, the rounded geometry 621 is provided at least on the lower surface of the locking mass 609 (and similarly on the opposite—top surface—of the locking mass 609) and serve mainly as stops against the edge 622 of the accelerometer base structure 602 to prevent the rounded tip element 612 of the locking mass 609 from disengaging the v-shaped geometry of the locking member 601 when the accelerometer of embodiment 600 is subjected to very high levels of acceleration in the direction of the arrow 615 or 616. In the blow up view "D" of FIG. 14*d*, the view of the rounded geometry 623 (a similar rounded geometry 626 is provided on the opposite side of the locking member 601—FIG. 13) that are provided on the other corners of the locking mass 609 are shown. The rounded geometry can be seen to cover both edges of the locking mass 609. This is the case since as the accelerometer of the accelerometer sensor 600 is subjected to high levels of acceleration in the direction of the arrow 615 or 616, the rounded corner geometry 623 may come in contact with either edge surfaces 624 or 625. The corner geometries 623 function as stops against the accelerometer base structure 602. They also perform the function described below.

When the accelerometer of the accelerometer sensor 600 is subjected to an acceleration in the direction of the arrow 615, the dynamic force resulting from the action of the acceleration on the inertia of the locking mass 609 will generate a force that will begin to cause the locking mass 609 to move essentially downward, while subjecting the spring element 610 to tension and the spring element 611 to compression. As the acceleration in the direction of the arrow 615 is increased and come close to the aforementioned high acceleration level (threshold), while the tip 612 of the locking mass 609 (FIG. 14*a*) pushes the locking member 601 towards the proof mass 613 (FIG. 14*b*), the rounded corner 623 is also forced down and to the left towards the surfaces 624 and 625 of the accelerometer base structure 602, respectively. The spring rates of the springs 610 and 611 and the geometry and mass of the locking member 601 are preferably selected such that when the acceleration in the direction of the arrow 615 reaches the prescribed high acceleration level threshold, the rounded corner 623 is in touch with the surfaces 624 and 625 of the accelerometer base structure 602. As a result, as the acceleration in the direction of the arrow 615 passes the aforementioned "high acceleration" threshold, the downward dynamic force acting on the locking mass 609 is increased, thereby increasing the force with which the tip 612 of the locking mass 609 would press on the surface 606 of the locking member 601, thereby increasing the force with which the locking member 601 holds (locks) the proof mass 613 to the accelerometer base structure 602, noting that the locking mass 609 may rotate slightly in the clockwise direction about the center of the rounded corner 623 during this process. The mass of the locking mass 609 and its geometry; the geometry of the tip 612 and the surfaces 605 and 606 of the locking member 601; and the geometries of the contacting surfaces and their gaps can be designed such that the aforementioned force with which the locking member 601 is pushed against the proof mass 609 is the same or slightly higher than the force with which the proof mass tip 614 pushes back against the locking member 601. As a result, as the acceleration in the direction of the arrow goes well beyond the aforementioned "high acceleration" threshold level, the proof mass 609 stays firmly locked to the accelerometer base structure 602. It will be appreciated by those skilled in the art that this is also the case when the accelerometer sensor 600 is accelerated to and beyond the aforementioned "high acceleration" threshold in the direction of the arrow 616. When the acceleration of the device in the direction 615 and 616 is ceased, the locking mass 609 is forced back by the springs 610 and 611, thereby the round tip 612 disengages the locking member 601, thereby the proof mass 609 is released and can begin to displace up or down in response to accelerations in the direction of 616 or 615, respectively, as long as the acceleration levels are below the aforementioned prescribed high acceleration threshold level.

As can be noted in the blow up view of FIG. 14a, the locking member 601 can be provided with rounded geometries 627 so that as the tip 612 of the locking member 601 presses against the surfaces 605 or 606 as the device 600 is accelerated in the direction of the arrow 616 or 615, respectively, the corresponding rounded geometries 627 would come to stop against the provided surfaces 628 of the accelerometer base structure 602.

In FIG. 13 and the blow up view of FIG. 14d, the surfaces 624 and 625 of the accelerometer base structure 602 are shown to be flat and perpendicular to each other. It is, however, appreciated by those skilled in the art that these surfaces may be designed as curved surfaces to reduce concentration of stress and distribute the contact forces.

Figure 14E:
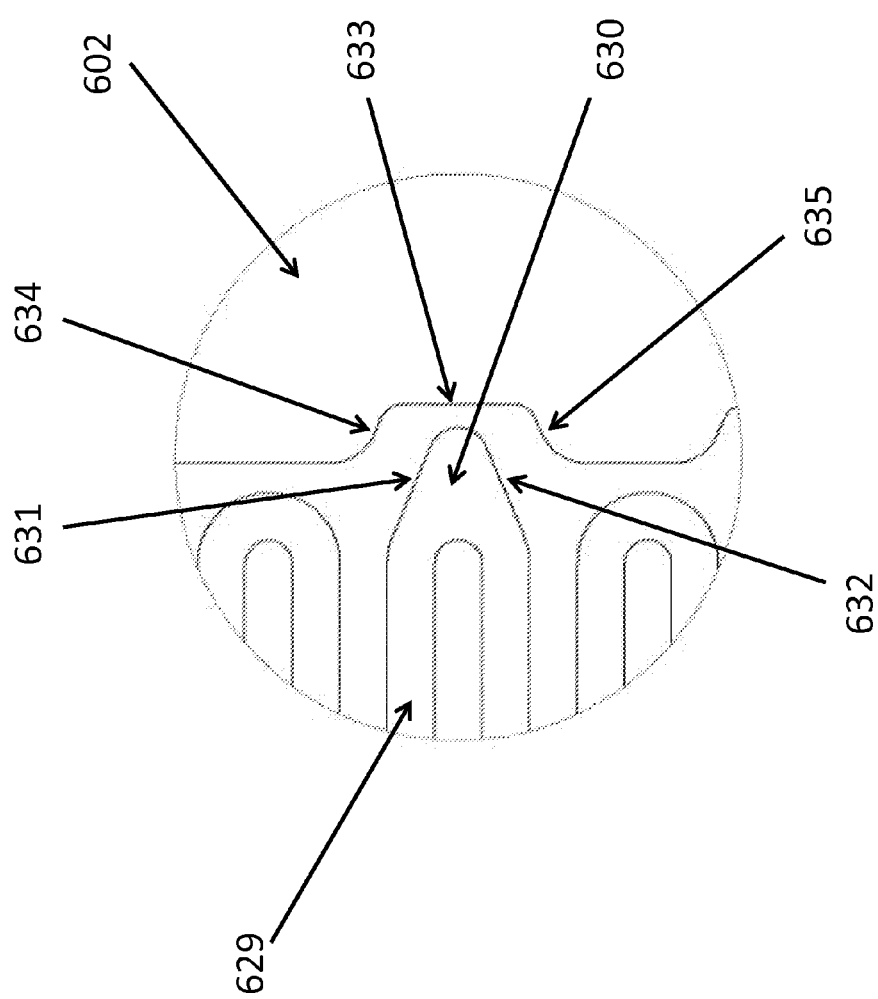
FIG. 14e illustrates a blow up view of another region of the embodiment of FIG. 13 illustrating geometrical details of the region.

By examining the accelerometer sensor 600 design presented in FIG. 13, it is evident that when the accelerometer is accelerated in the direction of the arrow 615 (116), the elements of the springs 610 and 611 are also forced down (up) due to dynamic forces generated because of their (even small) inertia. When the acceleration is in the direction of the arrow 615, the lower elements of the springs 610 and 611 are subjected to larger said dynamic forces due to the inertia of the elements above them. Similarly, when the acceleration is in the direction of the arrow 616, the upper elements of the springs 610 and 611 are subjected to larger dynamic forces due to the inertia of the elements above them. As a result, if the accelerometer sensor 600 is subjected to very high accelerations in either direction 615 or 616, the lower or higher elements of the springs 610 and 611 are subjected to high stress levels. To avoid failure of these elements at very high acceleration levels, the following means are provided to limit the level of deformation, thereby induced stresses, on the elements of the springs 610 and 611. Consider an element 629 of the spring 610 located close to the attachment point of the spring to the accelerometer base structure 602, shown in the blow up view "E" shown in FIG. 14e. The end (bend) portion 630 of the element 629 of the spring 610 is provided with two, preferably nearly flat, surfaces 631 and 632. The region of the accelerometer base structure 602 around the bend portion 630 is provided with a recess 633, with side walls 634 and 635, which are preferably essentially flat and nearly parallel to the surfaces 631 and 632, respectively. Then as the accelerometer sensor 600 is accelerated in the direction of the arrow 615 (616), the element 629 of the spring 610 moves down (up), and the surface 632 (631) of the bend portion 630 comes closer to the surface 635 (634) of the accelerometer base structure 602. The geometries of the bend portion 630 of the element 629 of the spring 610 and the recess 633 in the accelerometer base structure 602 can be designed such that at very high acceleration levels of the accelerometer sensor 600 in either direction 615 or 616 the surfaces 632 and 635 or the surfaces 631 and 634, respectively, come into contact, thereby preventing excessive deflection of the spring elements of the spring 610 and preventing potential failure of the spring 610. Similar arrangements of the spring end bend portion geometries and matching recess geometries in the accelerometer base structure 602 can be provided for all affected spring elements of the springs 610 and 611, thereby providing the means to protect these springs when the device 600 is subjected to very high acceleration levels.

Figure 15:
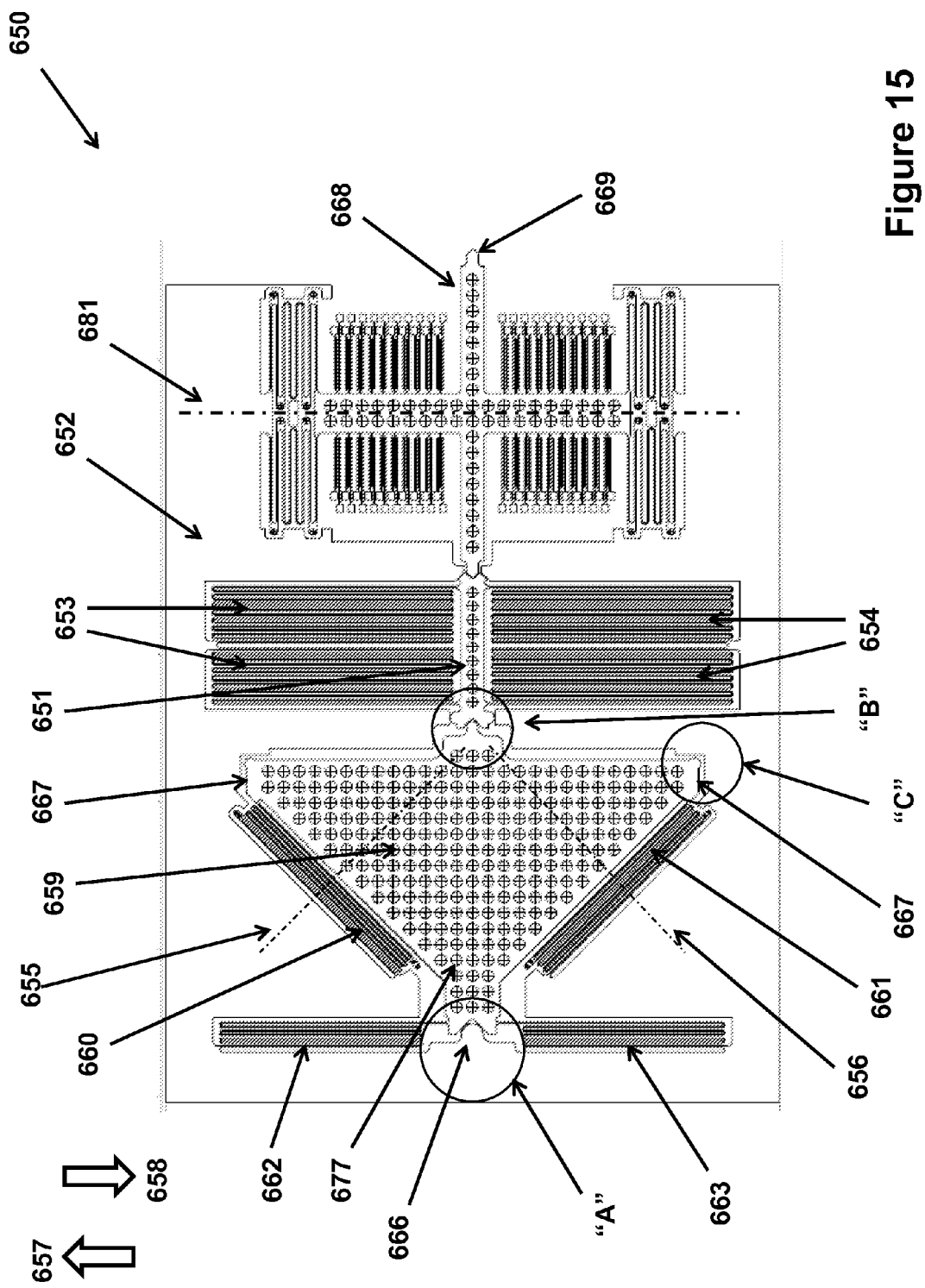
FIG. 15 illustrates the schematic of another accelerometer sensor embodiment with passive mechanism for locking the proof mass in a null position during periods of up or down accelerations above predetermined threshold as designed for fabrication using MEMS technology.

Another accelerometer sensor embodiment 650 designed for fabrication using MEMS technology or one of its different variations is shown in the schematic of FIG. 15. The accelerometer sensor 650 is essentially symmetric about the indicated line of symmetry 681 and in the schematic of FIG. 15 mostly one half (left hand) portion of the entire accelerometer sensor 650 is shown to make it possible to more clearly show the details of the device. The accelerometer sensor 650 is designed to operate mostly similar to the accelerometer sensor 600 of FIG. 13 and consists of similar components. The accelerometer sensor 600, however, provides additional features, which make it particularly suitable for fabrication using MEMS technology. It also provides certain features that allow it to operate properly and for its components to be better protected when the device is subjected to very high acceleration levels. Hereinafter the description is centered mainly about the differences between the accelerometer sensors 600 and 650 and reasons for providing such different characteristics.

In the accelerometer sensor 650, the locking mechanism consists of the locking member 651 (corresponding to the member 601 in the embodiment 600 of FIG. 13), which is attached to the base structure 652 of the accelerometer sensor 650 by symmetrically positioning at least a pair of springs 653 and 654 (corresponding to spring members 603 and 604 in the accelerometer sensor 600, respectively). It will be appreciated by those skilled in the art that by providing at least a pair of springs 653 and 654 on either side of the locking member 651, as the accelerometer sensor 650 is subjected to acceleration in a different direction, the locking member is supported in at least four positions (i.e., the attachment points of the springs 653 and 654), thereby it is better supported against dynamic loads in general as the locking member 601 is in the accelerometer sensor 600 of FIG. 13, but it is also significantly better supported against rotation relative to the base structure 652 of the accelerometer sensor 650. The pair of springs 653 and 654 are provided to allow the locking member 651 to translate laterally (i.e., horizontally as seen in the schematic of FIG. 15), acting as a combination of a sliding living joint and a spring element similar to the locking member 351 and the spring element 364 in the embodiment 350 of FIG. 5a.

The regions around the two ends of the locking member 651 are also similar to those of 601 of the accelerometer sensor 600 of FIG. 13 and as shown in the blow-up views "A" and "B" of FIGS. 14a and 14b, respectively, and the locking member 651 is similarly provided with v-shaped end geometries as shown in the blow up views "A" and "B" of FIGS. 14a and 14b.

The locking mechanism of the accelerometer sensor 650 also consists of the "locking mass" 659 (corresponding to the locking mass 609 in the embodiment 600 of FIG. 13), which is attached to the base structure 652 of the accelerometer sensor 650 by symmetrically positioning a pair of springs 660 and 661 and the pair of springs 662 an 663. The springs 660 and 661 are attached to the accelerometer base structure 652 on one end, such as to the regions 667 end of the locking mass 659. As a result, the locking mass 659 is supported at four locations that are far enough to support the locking mass in case it is subjected to acceleration in the direction of perpendicular to the plane of the accelerometer and also maximally prevented from rotation about axes parallel to the plane of the accelerometer, but stay free to rotate in the plane of the accelerometer, i.e., about axes perpendicular to the plane of the accelerometer.

Figure 16B:
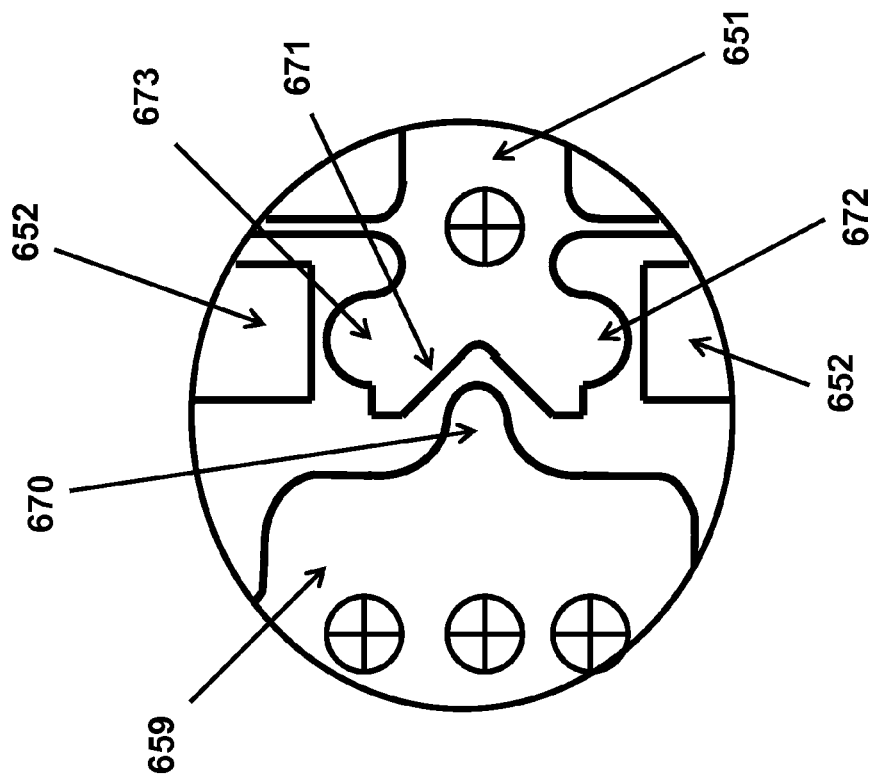
FIG. 16b illustrates a blow up view of another region of the embodiment of FIG. 15 illustrating geometrical details of the region.
Figure 16A:
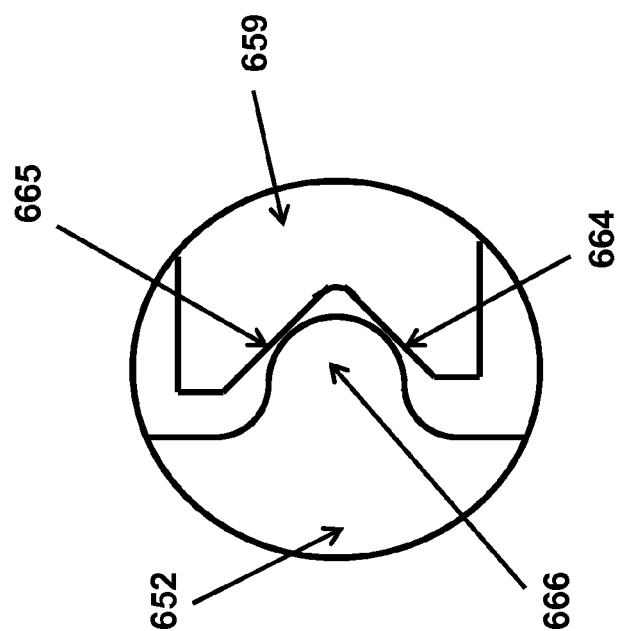
FIG. 16a illustrates a blow up view of one region of the embodiment of FIG. 15 illustrating geometrical details of the region.

The locking mass 659 is provided with a v-shaped geometry shown in the blow up view "A", FIG. 15, and redrawn in FIG. 16*a*. The v-shaped geometry with surfaces indicated by the numerals 664 and 665 is intended to engage with the rounded tip 666 provided on the accelerometer base structure 652 as shown in FIG. 16*a*. The v-shaped geometry and rounded tip 666 assembly allows for rotation of the locking mass 659 about the center of the rounded tip 666 in the plane of the accelerometer 650, i.e., about an axis perpendicular to the plane view shown FIG. 15.

It will be appreciated by those skilled in the art that the spring elements 660 and 661 are directed as shown in FIG. 15 with their centerlines 655 and 656 intersecting close to the rounded tip 666 of the locking mass 659 so that as the device 650 is subjected to acceleration in either direction 657 or 658, the spring forces would generate a minimal net force in the lateral direction while tending to resist rotation of the locking mass 659 about the center of the rounded tip 666.

The proof mass 668 of the accelerometer sensor 650 is similarly provided with rounded tips 669 (similar to the rounded tips 614 of the proof mass 613 of the embodiment 600 of FIG. 13, as is also shown in the blow up view of FIG. 14*b*). The rounded tips 669 are intended to similarly engage the corresponding v-shaped geometries of the locking member 651 as is shown in the blow up view of FIG. 14*b* and in FIG. 13 for the accelerometer sensor 600.

In a manner similar to that of the accelerometer sensor 600 of FIG. 13, if the accelerometer sensor 650 is subjected to acceleration in the direction of the arrow 657, the dynamic force resulting from the action of the acceleration on the inertia of the locking mass 659 will generate a force that will begin to cause the locking mass 659 to rotate in a clockwise direction about the center of the rounded tip 666. The spring element 661 and to a much less degree the spring 663 are thereby subjected to compression and the spring element 660 and to a much less degree the spring 662 are subjected to tension. The mass of the locking mass 659 and its geometry and the spring rates of the springs 660, 661, 662 and 663 are selected such that while the acceleration in the direction of the arrow 657 is below a certain selected level, the rounded tip 670 of the locking mass 659 (see the blow up view "B" of FIG. 16*b*) does not come into contact with the surface of the corresponding v-shaped geometry 671 of the locking member 651 as shown in the blow up view "B" of FIG. 16*b*. And as the acceleration in the direction of the arrow 657 is increased, the rounded tip of the element 670 will come in contact with the lower surface of the v-shaped geometry 671 and begin to push against it, thereby causing the locking member 651 to be displaced towards the right. The mass of the locking mass 659 relative to the mass of the proof mass 668 and the spring rates of the springs 660, 661, 662, 663, 653 and 654 are also selected such that when the acceleration in the direction of the arrow 657 reaches a prescribed threshold, the locking member 651 is displaced enough to the right to force the v-shaped geometry observed in FIG. 15 (similar to the v-shaped geometry with surfaces 607 and 608 in FIG. 14*b* for the accelerometer sensor 600 of FIG. 13) of the locking member 651 to come into contact with the left side rounded tip element 669 of the proof mass 668, preventing it from being displaced up or down, essentially locking the proof mass 668 in its null (near zero acceleration level) position to the accelerometer base structure 652. The right hand end of the locking member 651 is also provided with inclined surfaces (similar to the surfaces 617 and 618 in FIG. 14*b* for the accelerometer sensor 600 of FIG. 13) such that as the level of acceleration in the direction of the arrow 657 is increased, at or slightly after the locking member 651 has locked the proof mass 668 to the accelerometer base structure 652 as described, the inclined surfaces would engage their mating surfaces (similar to the surfaces 619 and 620 in FIG. 14*b* for the accelerometer sensor 600 of FIG. 13), that are provided on the accelerometer base structure 652, thereby preventing the end of the locking member 651 from moving up or down relative to the accelerometer base structure 652.

If the accelerometer of the accelerometer sensor 650 is subjected to an acceleration in the direction of the arrow 658, the dynamic force resulting from the action of the acceleration on the inertia of the locking mass 659 will generate a force that will begin to cause the locking mass 659 to rotate in the counterclockwise direction about the center of the rounded tip 666. The spring element 661 and to a much less degree the spring 663 are thereby subjected to tension and the spring element 660 and to a much less degree the spring 662 are subjected to compression. The mass of the locking mass 659 and its geometry and the spring rates of the springs 660, 661, 662 and 663 are similarly selected such that while the acceleration in the direction of the arrow 658 is below a certain selected level, the rounded tip 670 of the locking mass 659 (see the blow up view "B" of FIG. 16*b*) does not come into contact with the surface of the corresponding v-shaped geometry 671 of the locking member 651 as shown in the blow up view "B" of FIG. 16*b*. As the acceleration in the direction of the arrow 658 is increased, the rounded tip of the element 670 will come in contact with the upper surface of the v-shaped geometry 671 and begin to push against it, thereby causing the locking member 651 to be displaced towards the right. The mass of the locking mass 659 relative to the mass of the proof mass 668 and the spring rates of the springs 660, 661, 662, 663, 653 and 654 are also selected such that when the acceleration in the direction of the arrow 658 reaches a prescribed threshold, the locking member 651 is displaced enough to the right to force the v-shaped geometry observed in FIG. 15 (similar to the v-shaped geometry with surfaces 607 and 608 in FIG. 14*b* for the accelerometer sensor 600 of FIG. 13) of the locking member 651 to come into contact with the left side rounded tip element 669 of the proof mass 668, preventing it from being displaced up or down, essentially locking the proof mass 668 in its null (near zero acceleration level) position to the accelerometer base structure 652. The inclined surfaces provided on the right hand end of the locking member 651 discussed above will similarly engage and lock against the mating surfaces of the accelerometer base structure 652 as the level of acceleration in the direction of the arrow 658 is increased and approaches or slightly passes the prescribed threshold, thereby preventing the end of the locking member 651 from moving up or down relative to the accelerometer base structure 652.

Figure 16C:
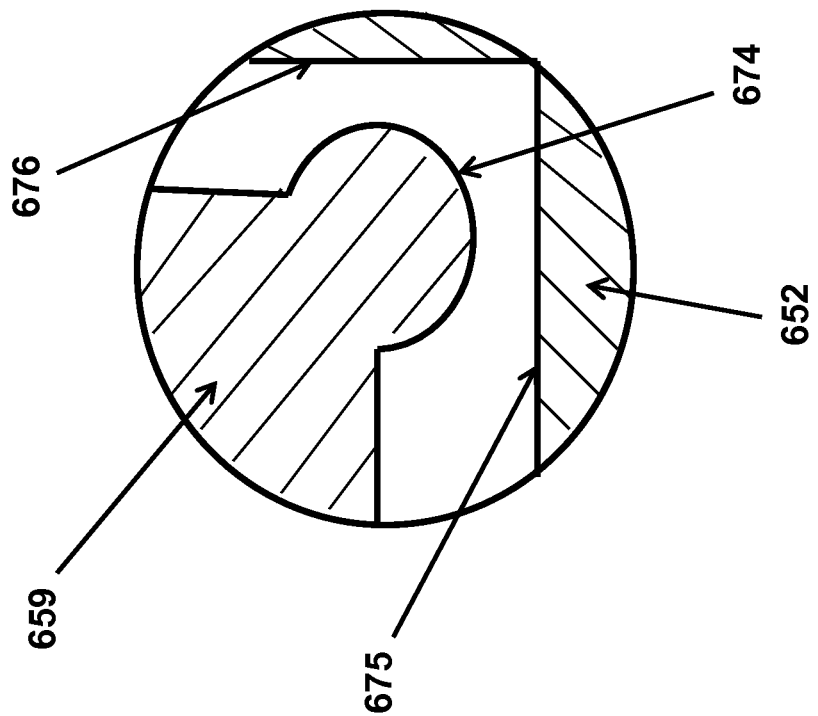
FIG. 16c illustrates a blow up view of another region of the embodiment of FIG. 15 illustrating geometrical details of the region.

As can be seen in the schematic of FIG. 15, the locking mass 659 can be provided with rounded corner geometries, such as shown in the blow up view "C" of FIG. 16*c* for the indicated corner. As can be seen in the blow up view "C" of FIG. 16*c*, the rounded geometry 674 is provided on the indicated corner of the locking mass 659 (and similarly on the opposite—top surface—of the locking mass 659) and serve mainly as stops against the edges 675 and 676 of the accelerometer base structure 652 to prevent excessive motion of the locking mass 659.

In the accelerometer sensor 650 design, the mass of the locking mass 659 and its geometry; the geometry of the tip 670 and the surfaces of the engaging v-shaped geometry 671 of the locking member 651; and the geometries of the contacting surfaces and their gaps can be designed such that the aforementioned force with which the locking member 651 is pushed against the proof mass 668 is the same or slightly higher than the force with which the tip 669 of the proof mass 668 pushes back against the locking member 651. As a result, as the acceleration in the direction of the arrow 657 or 658 goes even well beyond the aforementioned "high acceleration" threshold level, the proof mass 668 stays firmly locked to the accelerometer base structure 652.

As noted in the blow up view of FIG. 16b, similar to the accelerometer sensor 600 of FIG. 13, the locking member 651 can be provided with rounded geometries 672 and 673 so that as the tip 670 of the locking member 651 presses against the surfaces of the engaging v-shaped geometry 671 as the device 650 is accelerated in the direction of the arrow 657 or 658, the corresponding rounded geometries 672 and 673 would come to stop against the provided surfaces of the accelerometer base structure 652.

In the drawing of FIG. 15 and the blow up view of FIG. 16c, the surfaces 675 and 676 of the accelerometer base structure 652 are shown to be flat and perpendicular to each other. It will be, however, appreciated by those skilled in the art that these surfaces may be designed as curved surfaces to reduce concentration of stress and distribute the contact forces.

By examining the accelerometer sensor 650 design presented in FIG. 15, it is evident that when the accelerometer is accelerated in the direction of the arrow 657 (658), the elements of the springs 660 and 661 are also forced down (up) due to dynamic forces generated because of their (even small) inertia. When the acceleration is in the direction of the arrow 657, the lower elements of the springs 660 and 661 are subjected to larger dynamic forces due to the inertia of the elements above them. Similarly, when the said acceleration is in the direction of the arrow 658, the upper elements of the springs 660 and 661 are subjected to larger dynamic forces due to the inertia of the elements above them. As a result, if the accelerometer sensor 650 is subjected to very high accelerations in either direction 657 or 658, the lower or higher elements of the springs 660 and 661 are subjected to high stress levels. To avoid failure of these elements at very high acceleration levels, the following means can be provided to limit the level of deformation, thereby induced stresses, on the elements of the springs 660 and 661. This can be accomplished in a manner similar to that described above for the accelerometer sensor 600 of FIG. 13 and shown in the blow up view "E" of FIG. 14e, thereby providing means to protect these springs when the accelerometer sensor 650 is subjected to very high acceleration levels.

It is noted that in the drawing of the accelerometer sensor 650 shown in FIG. 15 the locking mass 659, locking member 651 and the proof mass 668 are provided with holes such as 677 of FIG. 15. These "access" holes (circular or with other types of geometries—even some open ended geometries on the side of the aforementioned members) are usually required in MEMS fabrication processing for properly releasing components with relatively large surfaces areas. Similar access holes (not shown) are considered to be provided on the equivalent components of the accelerometer sensor of FIG. 600 of FIG. 13.

As it is seen in the blow up views "A" ("B") of FIG. 13 of the accelerometer sensor 600, also shown in FIG. 14a (14b), the indicated v-shaped geometry is provided on the locking member 601, while the mating rounded tip 612 (614) is provided on the locking mass 609 (proof mass 613). It will be, however, appreciated by those skilled in the art that the locations of one or both v-shape geometries and their mating rounded tips could be exchanged. That is, for example the v-shaped geometry on the locking member could be provided on the locking mass 609 and the mating rounded tip 612 can be provided on the locking member 601. This can be also done for the accelerometer sensor 650 of FIG. 15.

In the above description of the accelerometer sensors 600 and 650, the sensory components, for example the comb shaped capacitive components attached to the proof mass (613 of accelerometer sensor 600 and 668 of accelerometer sensor 650) are not described since the general design and operation of comb type and other available sensory component design types are well known in the art (see for example, see *Microsystem Design* by Stephen D. Senturia, published by Kluwer Academic Publishers, 2001, or *Handbook of Modern Sensors*, Physics, Designs, and Applications, by Jacob Fraden, Fourth Edition, Springer Science+Business Media, 2010). It will be appreciated by those skilled in the art that the disclosed proof mass locking mechanisms may be used with any other type and/or configuration of the sensory components of accelerometers and/or gyros of various designs (or in fact any other inertia device) to protect such proof mass (inertia) elements from shock loading.

The above methods of designing the locking mechanisms for fabrication using MEMS technology were described by their application to the embodiment 350 of FIGS. 5a and 5b in the embodiments 600 and 650 of FIGS. 13 and 15. It is, however, appreciated by those skilled in the art that these methods can also be applied to the other embodiments described above, such as the embodiments 200, 250, 300, 350, 400, 450, 430 and 480 of FIGS. 2a, 3a, 4a, 5a, 6a, 7a, 8 and 9, respectively.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A MEMS sensor comprising:
   a base structure;
   at least one component formed to be movable relative to the base structure; and
   one or more locking mechanisms for locking the at least one component in a predetermined stationary position in response to external stimuli exceeding predetermined thresholds in at least first and second directions, where the first direction is different from the second direction.

2. The MEMS sensor of claim 1, wherein the at least one component is a locking member formed to be movable from the base structure and having at least two points connecting the locking member to the base structure.

3. The MEMS sensor of claim 2, further comprising spring members formed from the base structure and disposed at each of the at least two points connecting the locking member to the base structure such that the locking member is biased in at least one movable direction.

4. The MEMS sensor of claim 2, wherein the one or more locking mechanisms comprise a locking mass formed from the base structure to be movable in at least one movable direction and having at least two points connecting the locking mass to the base structure, wherein the locking member includes at least one of a concavity or convexity formed at an end thereof for mating with the other of the concavity and convexity formed at a corresponding end of the locking mass.

5. The MEMS sensor of claim 4, wherein the one or more locking mechanisms further comprises spring members formed from the base structure and disposed at each of the at least two points connecting the locking mass to the base structure such that the locking mass is biased in at least one movable direction.

6. The MEMS sensor of claim 5, wherein the locking mass is further rotatable about a pivot.

7. The MEMS sensor of claim 6, wherein the pivot comprises one of a convexity and concavity disposed on an end of the locking mass and the other of the convexity and concavity disposed on the base structure such that the convexity pivots about the concavity.

8. The MEMS sensor of claim 1, wherein the at least one component further includes one or more stops for limiting a movement of the at least one component to within a predetermined range.

9. The MEMS sensor of claim 8, wherein the one or more stops comprise one or more enlarged portions each positioned on a corner of the at least one component, the one or more enlarged portions configured to contact a portion of the base structure to limit the movement of the at least one component to within the predetermined range.

10. The MEMS sensor of claim 3, wherein the locking member further includes one or more stops for limiting a movement of the locking member to within a predetermined range.

11. The MEMS sensor of claim 10, wherein the one or more stops comprise one or more protrusions each positioned on an end of the spring members, the one or more protrusions configured to contact a portion of the base structure to limit the movement of the locking member to within the predetermined range.

12. The MEMS sensor of claim 4, wherein the locking mass further includes one or more stops for limiting a movement of the locking mass to within a predetermined range.

13. The MEMS sensor of claim 12, wherein the one or more stops comprise one or more enlarged portions each positioned on a corner of the locking mass, the one or more enlarged portions configured to contact a portion of the base structure to limit the movement of the locking mass to within the predetermined range.

14. A method for passively hardening a MEMS sensor from external stimuli greater than predetermined thresholds, the method comprising:
    forming a moving part and mechanism of the sensor to be movable relative to a base structure;
    protecting one or more of the moving part and the mechanism of the sensor from a first external stimulus in a first direction or minimizing residual vibration of the one or more moving part and mechanism from the first stimulus in the first direction; and
    protecting the one or more of the moving part and the mechanism of the sensor from a second external stimulus in a second direction or minimizing residual vibration of the one or more moving part and mechanism from the second stimulus in the second direction;
    wherein one or more of the first and second stimuli or first and second directions are different.

15. The method of claim 14, wherein the protecting comprises holding the moving part from moving with the mechanism where the first or the second external stimulus is an acceleration in the first or second directions, respectively, greater than a predetermined threshold.

16. The method of claim 15, wherein the moving part is held with a greater force by the mechanism as the acceleration increases.

* * * * *